(12) United States Patent
Lee et al.

(10) Patent No.: US 9,343,660 B2
(45) Date of Patent: *May 17, 2016

(54) MAGNETIC MEMORY DEVICE

(71) Applicant: Samsung Electronics Co., Ltd., Suwon-si (KR)

(72) Inventors: Jangeun Lee, Suwon-si (KR); Sechung Oh, Suwon-si (KR); Jeahyoung Lee, Seoul (KR); Woojin Kim, Yongin-si (KR); Junho Jeong, Suwon-si (KR); Woo Chang Lim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 34 days.

This patent is subject to a terminal disclaimer.

(21) Appl. No.: 14/583,831

(22) Filed: Dec. 29, 2014

(65) Prior Publication Data
US 2015/0115380 A1 Apr. 30, 2015

Related U.S. Application Data

(63) Continuation of application No. 14/464,835, filed on Aug. 21, 2014, now Pat. No. 9,048,417, which is a continuation of application No. 13/926,048, filed on Jun. 25, 2013, now Pat. No. 8,847,341, which is a continuation of application No. 13/091,215, filed on Apr. 21, 2011, now Pat. No. 8,476,722.

(30) Foreign Application Priority Data

Apr. 21, 2010 (KR) .................. 10-2010-0037017

(51) Int. Cl.
*H01L 43/08* (2006.01)
*H01L 43/10* (2006.01)
(Continued)

(52) U.S. Cl.
CPC ............. *H01L 43/10* (2013.01); *B82Y 25/00* (2013.01); *H01F 10/3254* (2013.01); *H01F 10/3286* (2013.01); *H01L 27/222* (2013.01); *H01L 43/02* (2013.01); *H01L 43/08* (2013.01); *H01F 10/123* (2013.01); *H01F 10/3272* (2013.01)

(58) Field of Classification Search
CPC ....... H01L 43/08; H01L 27/228; H01L 43/02; H01L 43/10
USPC ....................................................... 257/421
See application file for complete search history.

(56) References Cited

U.S. PATENT DOCUMENTS 6,166,948 A * 12/2000 Parkin et al. .................. 365/173
7,372,116 B2 5/2008 Fullerton et al.
(Continued)

FOREIGN PATENT DOCUMENTS

JP 2001-267523 9/2001
JP 2002-353535 12/2002
(Continued)

OTHER PUBLICATIONS

Bruno, P., "Theory of Interlayer Exchange Interactions in Magnetic Multilayers," J. Phys.: Condens. Matters 11 (1999), p. 9403-9419.

*Primary Examiner* — Monica D Harrison
(74) *Attorney, Agent, or Firm* — Myers Bigel & Sibley, P.A.

(57) ABSTRACT

A magnetic memory device is provided. The magnetic memory device includes a first vertical magnetic layer and a second vertical magnetic layer on a substrate, a tunnel barrier layer between the first vertical magnetic layer and the second vertical magnetic layer, and an exchange-coupling layer between a first sub-layer of the first vertical magnetic layer and a second sub-layer of the first vertical magnetic layer.

8 Claims, 18 Drawing Sheets

(51) Int. Cl.
    *B82Y 25/00*    (2011.01)
    *H01F 10/32*    (2006.01)
    *H01L 43/02*    (2006.01)
    *H01L 27/22*    (2006.01)
    *H01F 10/12*    (2006.01)

(56) References Cited

U.S. PATENT DOCUMENTS

| | | |
|---|---|---|
| 7,480,173 B2 | 1/2009 | Guo et al. |
| 7,583,529 B2 | 9/2009 | Chen et al. |
| 7,663,197 B2 | 2/2010 | Nagase et al. |
| 8,174,086 B2 | 5/2012 | Fukami et al. |
| 8,476,722 B2 | 7/2013 | Lee et al. |
| 8,847,341 B2 * | 9/2014 | Lee et al. ............ 257/421 |
| 2007/0086121 A1 | 4/2007 | Nagase et al. |
| 2009/0080238 A1 | 3/2009 | Yoshikawa et al. |
| 2013/0285178 A1 | 10/2013 | Lee et al. |

FOREIGN PATENT DOCUMENTS

| | | |
|---|---|---|
| JP | 2002-359412 | 12/2002 |
| JP | 2007-305629 | 11/2007 |
| JP | 2009-081216 A | 4/2009 |

\* cited by examiner

MAGNETIC MEMORY DEVICE

CROSS-REFERENCE TO RELATED APPLICATION

This U.S. non-provisional patent application claims priority as a continuation application of U.S. patent application Ser. No. 14/464,835, filed Aug. 21, 2014, which is a continuation application of U.S. patent application Ser. No. 13/926,048, filed Jun. 25, 2013, which is a continuation application of U.S. patent application Ser. No. 13/091,215, filed Apr. 21, 2011, which in turn claims priority under 35 U.S.C. §119 of Korean Patent Application No. 10-2010-0037017, filed on Apr. 21, 2010, the entire contents of each of which are hereby incorporated herein by reference.

BACKGROUND

The present disclosure herein relates to semiconductor devices and, more specifically, to magnetic memory devices.

With the advent of high-speed and low-power consumption electronic devices, built-in memory devices are required that can perform fast read and write operations and that have a low operating voltage. Magnetic memory devices have been studied as memory devices that may meet these requirements. Due to their high-speed operation and non-volatile characteristics, magnetic memory devices have been hailed as a potential next generation memory device.

A magnetic memory device may include a Magnetic Tunnel Junction (MTJ) pattern. An MTJ pattern may be formed by two (2) magnetic layers with a dielectric layer interposed therebetween and may have a different resistivity depending on the magnetization directions of the two magnetic layers. Specifically, an MTJ pattern may have a high resistivity when the magnetization direction of the two magnetic layers are anti-parallel to each other and may have a lower resistivity when the magnetization direction of the two magnetic layers is parallel to each other. This difference in resistivity may be used to store data in a magnetic memory device.

SUMMARY

Embodiments of the present inventive concept may provide improved magnetic memory devices. Some of the embodiments disclosed herein may provide highly reliable magnetic memory devices and/or magnetic memory devices that exhibit an increased lifetimes.

In some embodiments, magnetic memory devices are provided that include a first vertical magnetic layer and a second vertical magnetic layer, the second vertical magnetic layer including a first sub-layer and a second sub-layer, a tunnel barrier layer between the first vertical magnetic layer and the second vertical magnetic layer; and an exchange-coupling layer between the first sub-layer and the second sub-layer.

The magnetic memory device may further comprise a first contact magnetic layer between the tunnel barrier layer and the first vertical magnetic layer and a second contact magnetic layer between the tunnel barrier layer and the second vertical magnetic layer.

The magnetic memory device may further comprise a first additional exchange-coupling layer between the second contact magnetic layer and the second vertical magnetic layer.

The magnetic memory device may further comprise a second additional exchange-coupling layer between the first contact magnetic layer and the first vertical magnetic layer.

The first vertical magnetic layer may include a first sub-layer and a second sub-layer, and the magnetic memory device may further comprise a third additional exchange-coupling layer between the first sub-layer of the first vertical magnetic layer and the second sub-layer of the first vertical magnetic layer.

The magnetic memory device may further comprise a diffusion barrier layer between the second vertical magnetic layer and the second contact magnetic layer.

The first sub-layer of the second vertical magnetic layer may include alternately and repeatedly stacked non-magnetic layers and ferromagnetic layers, and the diffusion barrier layer may be in contact with the ferromagnetic layer of the first sub-layer.

The ferromagnetic layer of the first sub-layer in contact with the diffusion barrier layer may comprise a different material from the rest of the ferromagnetic layers in the first sub-layer.

The magnetic memory device may further comprise an additional diffusion barrier between the first vertical magnetic layer and the first contact magnetic layer.

The respective first sub-layer and second sub-layer may comprise alternately and repeatedly stacked non-magnetic layers and ferromagnetic layers; the exchange-coupling layer may comprise a first surface and a second surface, the surfaces being opposite to each other; and the first surface of the exchange-coupling layer may be in contact with the ferromagnetic layer of the first sub-layer and the second surface of the exchange-coupling layer may be in contact with the ferromagnetic layer of the second sub-layer.

The ferromagnetic layer in contact with the first surface may be thicker than the rest of the respective ferromagnetic layers in the first sub-layer, and the ferromagnetic layer in contact with the second surface may be thicker than the rest of the respective ferromagnetic layers in the second sub-layer.

The ferromagnetic layer in contact with the first surface may comprise a different material from the rest of the ferromagnetic layers in the first sub-layer, and the ferromagnetic layer in contact with the second surface may comprise a different material from the rest of the ferromagnetic layers in the first sub-layer.

The ferromagnetic layer of the first sub-layer in contact with the first surface may comprise a same material as the ferromagnetic layer of the second sub-layer in contact with the second surface.

One of the first vertical magnetic layer and the second vertical magnetic layer may be a reference layer and the other one may be a free layer.

The second vertical magnetic layer may be a reference layer.

The exchange-coupling layer may be 2 Å to 18 Å thick.

According to the present inventive concept, an exchange-coupling layer is interposed between a first sub-layer and a second sub-layer, which are contained in the second vertical magnetic layer. As a result, a magnetic memory device can stably maintain magnetization directions, thereby achieving a highly reliable magnetic memory device.

DETAILED DESCRIPTION OF THE EMBODIMENTS

Figure 1A:
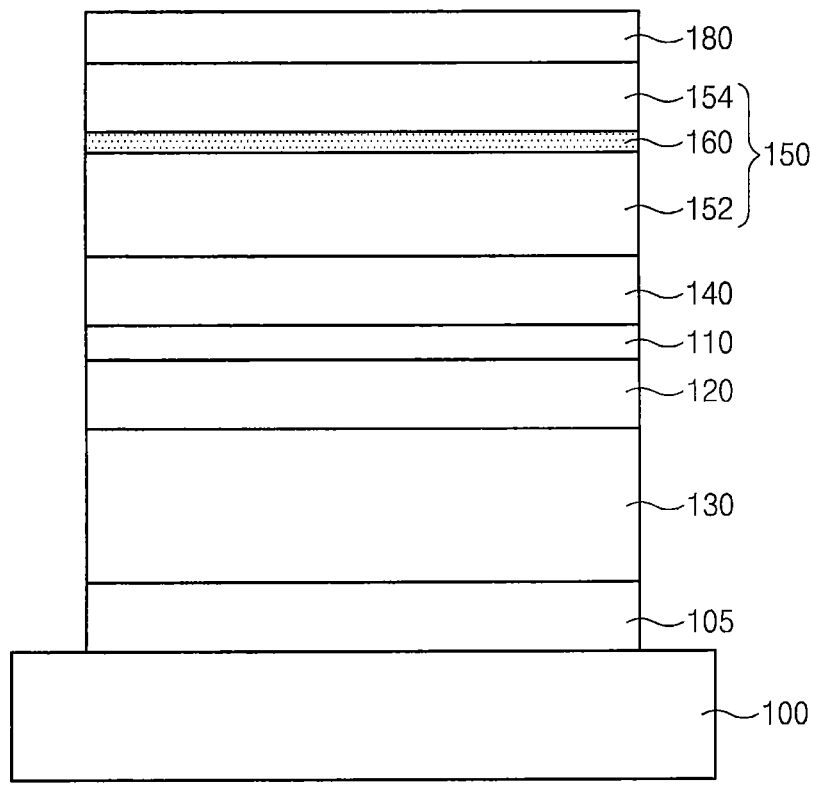
FIG. 1A is a cross sectional view illustrating a magnetic memory device according to a first example embodiment of the present inventive concept.

Hereinafter, example embodiments of the present inventive concept will be explained in detail with reference to the accompanying drawings. The embodiments of the present inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will be understood that when a film (or a layer) is referred to as being "on" another film (or a layer), it can be directly on the other film or intervening elements may also be present. In the drawings, the sizes and thicknesses of films (or layers) and regions may be exaggerated for clarity. It will be understood that, although the terms first, second, third, etc. may be used herein to describe various regions and films (or layers), these regions and films should not be limited by these terms. These terms are only used to distinguish one region or one film (or a layer) from another region or another film (or another layer). Thus, a first film in some embodiments could be termed a second film in other embodiments. It will also be understood that exemplary embodiments of the present inventive concept explained and illustrated herein include their complementary counterparts. The term "and/or" in this specification is used to refer to include at least one of an associated listed items. Like reference numerals in this specification refer to like elements throughout.

Figure 1B:
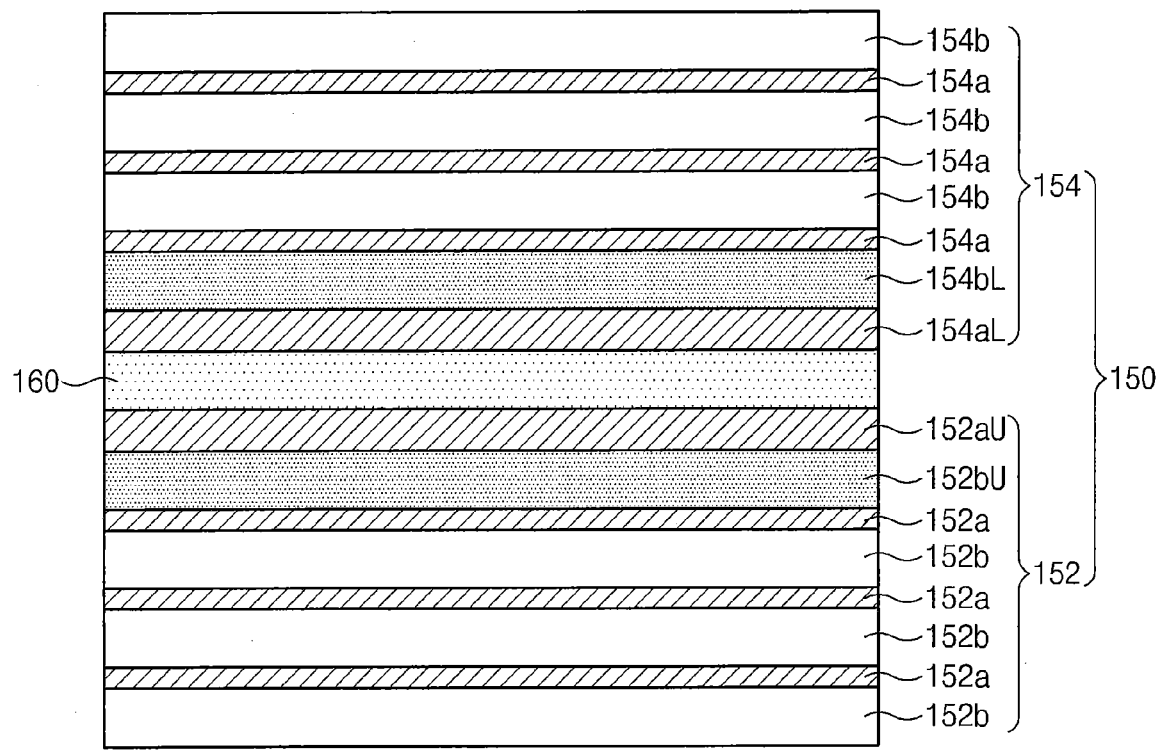
FIG. 1B is a cross sectional view illustrating a vertical magnetic layer that is included in the magnetic memory device according to the first example embodiment of the present inventive concept.

Hereinafter, a magnetic memory device according to the first example embodiment of the present inventive concept will be explained. FIG. 1A is a cross sectional view of the magnetic memory device according to the first example embodiment of the present inventive concept, and FIG. 1B is a cross sectional view of a vertical magnetic layer that is included in the magnetic memory device according to the first example embodiment of the present inventive concept.

Referring to FIG. 1A, a first vertical magnetic layer 130 and a second vertical magnetic layer 150 may be disposed on a substrate 100. A tunnel barrier layer 110 may be interposed between the first and second vertical magnetic layers 130, 150. The second vertical magnetic layer 150 may comprise a first sub-layer 152 and a second sub-layer 154. An exchange coupling layer 160 may be interposed between the first sub-layer 152 and the second sub-layer 154. An MTJ pattern may comprise the first vertical magnetic layer 130, the tunnel barrier layer 110, and the second vertical magnetic layer 150. A lower electrode 105 may be disposed between the MTJ pattern and the substrate 100.

As illustrated, the first vertical magnetic layer 130, the tunnel barrier layer 110, and the second vertical magnetic layer 150 may be sequentially stacked on the lower electrode 105. However, the present inventive concept is not so limited. According to another embodiment of the present inventive concept, the second vertical magnetic layer 150, the tunnel barrier layer 110, and the first vertical magnetic layer 130 may be sequentially stacked on the lower electrode 105. Hereinafter, for the sake of convenience, the present inventive concept will be explained with reference to an embodiment in which the first vertical magnetic layer 130, the tunnel barrier layer 110, and the second vertical magnetic layer 150 are sequentially stacked on the lower electrode 105.

The substrate 100 may comprise a semiconductor substrate and a dielectric layer that is formed on the semiconductor substrate. The lower electrode 105 may be disposed on the dielectric layer included in the substrate 100. The substrate 100 may further comprise a contact plug (not shown) in the dielectric layer. The lower electrode 105 may be configured to electrically connect to the contact plug.

The tunnel barrier layer 110 may be disposed on the substrate 100. The tunnel barrier layer 110 may comprise an insulating material. For example, in some embodiments, the tunnel barrier layer 110 may comprise at least one selected from the group consisting of magnesium oxide (MgO), titanium oxide (TiO), aluminum oxide (AlO), magnesium-zinc oxide (MgZnO), magnesium-boron oxide (MgBO), titanium nitride (TiN), or vanadium nitride (VN). The tunnel barrier layer 110 may be formed of multiple layers. For example, in some embodiments, the tunnel barrier layer 110 may be magnesium/magnesium oxide (Mg/MgO), magnesium oxide/magnesium (MgO/Mg), or magnesium/magnesium oxide/magnesium (Mg/MgO/Mg). The tunnel barrier layer 110 may have a thickness that is thinner than the spin diffusion distance. For example, the tunnel barrier 110 may be a magnesium oxide (MgO) layer having a thickness of approximately 10 Å.

The first vertical magnetic layer 130 may be disposed on (either directly or indirectly) a first surface of the tunnel barrier layer 110 and the second vertical magnetic layer 150 may be disposed on a second surface of the tunnel barrier layer 110, which is opposite the first surface. In the case that programming current flows in a perpendicular direction with respect to a top surface of the substrate 100, the first vertical magnetic layer 130 and the second vertical magnetic layer 150 may be constructed to have a magnetization direction that is parallel and/or anti-parallel to the programming current.

The first vertical magnetic layer 130 may include alternately and repeatedly stacked ferromagnetic layers and non-magnetic layers. For example, the ferromagnetic layers included in the first vertical magnetic layer 130 may comprise at least one selected from the group consisting of iron (Fe), cobalt (Co), or nickel (Ni), and the non-magnetic layers included in the first vertical magnetic layer 130 may comprise at least one selected from the group consisting of chromium (Cr), platinum (Pt), palladium (Pd), iridium (Ir), ruthenium (Ru), rhodium (Rh), osmium (Os), rhenium (Re), gold (Au), or copper (Cu).

For example, the first vertical magnetic layer 130 may comprise $[Co/Pt]_m$, $[Co/Pd]_m$ or a combination thereof. The non-magnetic layer and ferromagnetic layers included in the first vertical magnetic layer 130 may be stacked, for example, two (2) to twenty (20) times. The ferromagnetic layers included in the first vertical magnetic layer 130 may be very thin layers having a thickness of a single to several atomic layers. A seed layer may be interposed between the lower electrode 105 and the first vertical magnetic layer 130.

The second vertical magnetic layer 150 may comprise a first sub-layer 152 and a second sub-layer 154. An exchange-coupling layer 160 may be interposed between the first sub-layer 152 and the second sub-layer 154. The exchange-coupling layer 160 may have a first surface and a second surface that is opposite the first surface. The first sub-layer 152 may contact the first surface of the exchange-coupling layer 160 and the second sub-layer 154 may contact the second surface of the exchange-coupling layer 160. A magnetization direction of the first sub-layer 152 and a magnetization direction of the second sub-layer 154 may be exchange-coupled in anti-parallel by the exchange-coupling layer 160. As a result, the second vertical magnetic layer 150 may have two magnetization directions, which are anti-parallel to each other. For example, in the case that the first sub-layer 152 has a magnetization direction of a first direction, the second sub-layer 154 may have a magnetization direction of a second direction that is anti-parallel with the first direction.

For example, the exchange-coupling layer 160 may comprise ruthenium (Ru), rhodium (Rh), chromium (Cr), and/or iridium (Ir). The exchange-coupling layer 160 may be approximately 2 Å to approximately 18 Å thick in some embodiments.

The first sub-layer 152 and the second sub-layer 154 may comprise alternately and repeatedly stacked non-magnetic layers and ferromagnetic layers. This will be explained in more detail with reference to FIG. 1B.

Referring FIG. 1B, the first sub-layer 152 may comprise alternately and repeatedly stacked ferromagnetic layers 152aU, 152a, and non-magnetic layers 152bU, 152b. The first surface of the exchange-coupling layer 160 may contact the uppermost ferromagnetic layer 152aU among the ferromagnetic layers 152a, 152aU included in the first sub-layer 152. The uppermost ferromagnetic layer 152aU may be thicker than the rest of the ferromagnetic layers 152a that are included in the first sub-layer 152. The thicknesses of the rest of the ferromagnetic layers 152a may be substantially the same. For example, the uppermost ferromagnetic layer 152aU may be approximately 5 Å thick and the rest of the ferromagnetic layers 152a may be approximately 2 Å thick. The ferromagnetic layers 152a, 152aU may comprise the same material. For example, the ferromagnetic layers 152a, 152aU may comprise cobalt (Co).

The uppermost non-magnetic layer 152bU of the first sub-layer 152 adjoining the first surface of the exchange-coupling layer 160 may comprise a different material from the rest of the non-magnetic layers 152b. The rest of the non-magnetic layers 152b may each be formed of the same material. For example, the uppermost non-magnetic layers 152bU may comprise platinum (Pt), while the rest of the non-magnetic layers 152b may comprise palladium (Pd). Although the ferromagnetic layers 152aU, 152a and non-magnetic layers 152bU, 152b are stacked 4 times in the drawing, they can alternatively be stacked 2 times, 3 times or more than 5 times.

The second sub-layer 154 may comprise alternately and repeatedly stacked ferromagnetic layers 154aL, 154a, and non-magnetic layers 154bL, 154b. The second surface of the exchange-coupling layer 160 may contact the lowermost ferromagnetic layer 154aL among the ferromagnetic layers 154aL, 154a included in the second sub-layer 154. The lowermost ferromagnetic layer 154aL may be thicker than the rest of the ferromagnetic layers 154a that are included in the second sub-layer 154. The thicknesses of the rest of the ferromagnetic layers 154a may be substantially the same. For example, the lowermost ferromagnetic layer 154aL may be approximately 5 Å thick and the rest of the ferromagnetic layers 154a may be approximately 2 Å thick. The ferromagnetic layers 154a, 154aL may comprise the same material. For example, the ferromagnetic layers 154aL, 154a may comprise cobalt (Co).

The lowermost non-magnetic layer 154bL of the second sub-layer 154 adjoining the second surface of the exchange-coupling layer 160 may comprise a different material from the rest of the non-magnetic layers 154b. The rest of the non-magnetic layers 154b may each be formed of the same material. For example, the lowermost non-magnetic layers 152bL may comprise platinum (Pt), while the rest of the non-magnetic layers 154b may comprise palladium (Pd). Although the ferromagnetic layers 154aL, 154a and non-magnetic layers 154bL, 154b are stacked 4 times in the drawing, they can be stacked 2 times, 3 times or more than 5 times in other embodiments.

One of the first vertical magnetic layer 130 and the second vertical magnetic layer 150 can be used as a reference layer and the other one may be used as a free layer of a magnetic memory cell. The number of stacking times of non-magnetic and ferromagnetic layers of the first vertical magnetic layer 130 may be different from the number of stacking times of non-magnetic and ferromagnetic layers of the first and second sub layers 152, 154 in the second vertical magnetic layer 150. According to the difference of these stacking times, the first vertical magnetic layer 130 and the second vertical magnetic layer 150 may be divided into a free layer and a reference layer. For example, the number of stacking times of non-magnetic and ferromagnetic layers of the first vertical magnetic layer 130 may be larger than the number of stacking times of non-magnetic and ferromagnetic layers of the first and second sub layers 152, 154. In this case, the first vertical magnetic layer 130 may be a free layer and the second vertical magnetic layer 150 may be a reference layer.

Referring again to FIG. 1A, a first contact magnetic layer 120 may be disposed between the tunnel barrier layer 110 and the first vertical magnetic layer 130, and a second contact magnetic layer 140 may be disposed between the tunnel barrier layer 110 and the second vertical magnetic layer 150. The tunnel barrier layer 110 may be disposed between the first contact magnetic layer 120 and the second contact magnetic layer 140. A magnetization direction of the first contact magnetic layer 120 may be exchange-coupled in parallel with a magnetization direction of the first vertical magnetic layer 130, thereby having the same magnetization direction as the first vertical magnetic layer 130. A magnetization direction of the second contact magnetic layer 140 may be exchange-coupled in parallel with a magnetization direction of the first sub-layer 152, thereby having the same magnetization direction as the first sub-layer 152.

Any one contact magnetic layer of the first contact magnetic layer 120 and the second contact magnetic layer 140 can be used as a reference layer and the other one may be used as a free layer of a magnetic memory cell. For example, in the case that the first vertical magnetic layer 130 is used as a free layer and the second vertical magnetic layer 150 is used as a reference layer, the first contact magnetic layer 120 can be used as a free layer and the second contact magnetic layer 140 can be used as a reference layer.

The first contact magnetic layer 120 and the second contact magnetic layer 140 may each comprise a soft magnetic material. The saturation magnetization quantity of the contact magnetic layer being used as a reference layer may be larger than the saturation magnetization quantity of the contact magnetic layer being used as a free layer. The difference in the saturation magnetization quantity between the reference layer and the free layer can be adjusted depending on the contents of ferromagnetic materials contained in the first contact magnetic layer 120 and in the second contact magnetic layer 140, respectively. In the case where the first contact magnetic layer 120 is used as a free layer and the second contact magnetic layer 140 is used as a reference layer, the content of ferromagnetic materials contained in the first contact magnetic layer 120 may be lower than the content of ferromagnetic materials contained in the second contact magnetic layer 140. Conversely, in the case where the first contact magnetic layer 120 is used as a reference layer and the second contact magnetic layer 140 is used as a free layer, the content of ferromagnetic materials contained in the first contact magnetic layer 120 may be higher than the content of ferromagnetic materials contained in the second contact magnetic layer 140. For example, the ferromagnetic material may comprise cobalt (Co), iron (Fe), and/or nickel (Ni).

As mentioned in the foregoing, the difference in the saturation magnetization quantity between the reference layer and the free layer can be adjusted depending on the contents of non-magnetic materials contained in the first contact magnetic layer 120 and the second contact magnetic layer 140. In the case where the first contact magnetic layer 120 is used as a free layer and the second contact magnetic layer 140 is used as a reference layer, the content of non-magnetic materials contained in the first contact magnetic layer 120 may be lower than the content of non-magnetic materials contained in the second contact magnetic layer 140. Conversely, in the case where the first contact magnetic layer 120 is used as a reference layer and the second contact magnetic layer 140 is used as a free layer, the content of non-magnetic materials contained in the first contact magnetic layer 120 may be higher than the content of non-magnetic materials contained in the second contact magnetic layer 140. For example, the non-magnetic material may comprise titanium (Ti), aluminum (Al), silicon (Si), magnesium (Mg), and/or tantalum (Ta).

The first contact magnetic layer 120 and the second contact magnetic layer 140 may have high spin polarization rates and low damping coefficients. The first contact magnetic layer 120 and the second contact magnetic layer 140 may further comprise at least one selected from the group of non-magnetic materials consisting of boron (B), zinc (Zn), ruthenium (Ru), silver (Ag), gold (Au), copper (Cu), carbon (C) and nitrogen (N). For example, the first contact magnetic layer 120 and the second contact magnetic layer 140 may comprise CoFe or NiFe and may further include boron.

A capping layer 180 may be provided on the second vertical magnetic layer 150. The capping layer 180 may comprise, for example, tantalum (Ta), aluminum (Al), copper (Cu), gold (Au), silver (Ag), titanium (Ti), tantalum nitride (TaN), and/or titanium nitride (TiN).

The contact magnetic layers 120, 140 and the tunnel barrier layer 110 may be included in the MTJ pattern. Data can be stored in a magnetic memory device by using the resistivity difference according to being parallel or anti-parallel of the magnetization directions of the contact magnetic layers 120, 140.

For example, the first contact magnetic layer 120 can be a free layer and the second contact magnetic layer 140 can be a reference layer. In the case where electrons move from the first contact magnetic layer 120 into the second contact magnetic layer 140, electrons having a spin of a first magnetization direction, which is parallel to the second contact magnetic layer 140, may pass through the tunnel barrier layer 110. On the other hand, most of electrons having a spin of a second magnetization direction, which is anti-parallel to the second contact magnetic layer 140, may not pass through the tunnel barrier layer 110 but instead are reflected, and thereby remain within the first contact magnetic layer 120.

Due to the electrons that remain in the first contact magnetic layer 120 having a spin of the second direction, a magnetization direction of the first contact magnetic layer 120 may be a second direction. Accordingly, the first contact magnetic layer 120 and the second contact magnetic layer 140 may have magnetization directions that are opposite to each other and, as a result, the MTJ may have a relatively high first resistance value.

Conversely, in the case where the first contact magnetic layer 120 is a free layer and the second contact magnetic layer 140 is a reference layer, electrons move from the second contact magnetic layer 140 into the first contact magnetic layer 120. Due to the electrons having a spin of a first direction arriving at the first contact magnetic layer 120, the first contact magnetic layer may have a magnetization direction of the first direction. Accordingly, in this case, the MTJ may have a relatively low second resistance value.

As disclosed in the foregoing, depending on the directions of electrons flowing along the MTJ, the resistance value of the MTJ may vary, and using this resistivity difference, data can be stored in a magnetic memory cell.

According to the magnetic memory device explained above, the exchange-coupling layer 160 may be disposed within the second vertical magnetic layer 150. Due to this, mutual coupling force, the magnetization directions of the second vertical magnetic layer 150 may be stably maintained. Accordingly, a mutual interference phenomena between the first vertical magnetic layer 130 and the second vertical magnetic layer 150 may be reduced and/or minimized. As a result, magnetization directions of a magnetic memory device including the first and the second vertical magnetic layers 130, 150 may be stably maintained, thereby achieving a highly reliable magnetic memory device.

In a magnetic memory device according to the aforementioned first example embodiment of the present inventive concept, diffusion barrier layers can be interposed between the first contact magnetic layer 120 and the first vertical magnetic layer 130 and between the second contact magnetic layer 140 and the second vertical magnetic layer 150. This will be explained with reference to FIG. 2A.

Figure 2A:
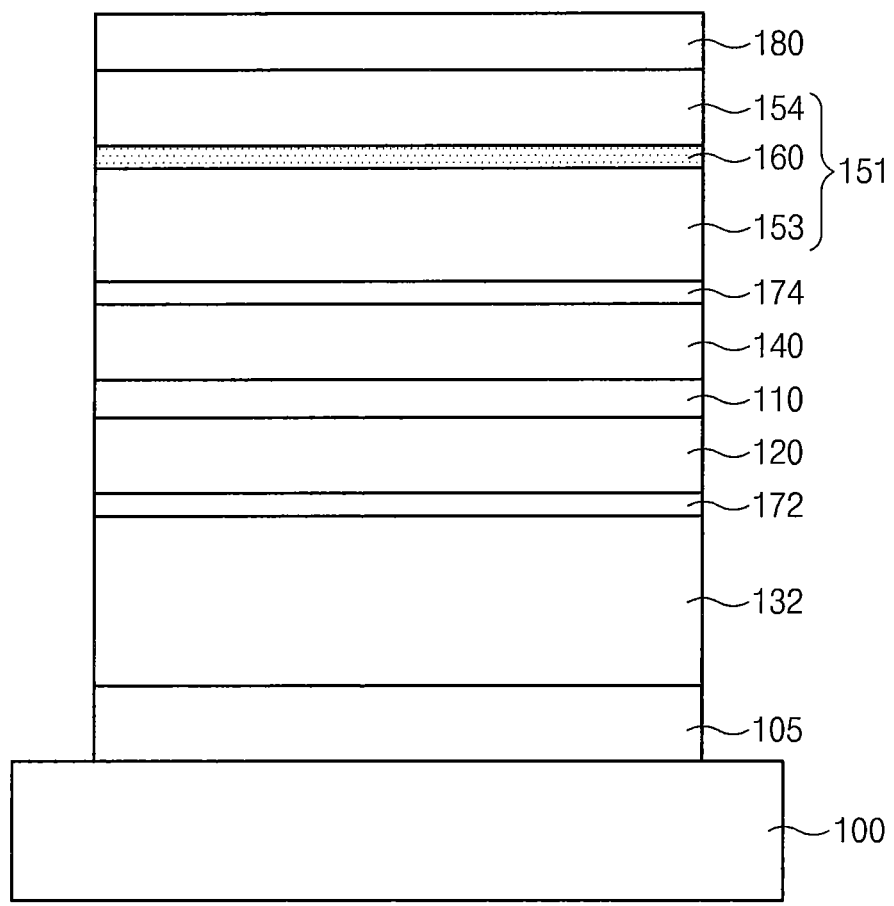
FIG. 2A is a cross sectional view illustrating a magnetic memory device according to a modified version of the first example embodiment of the present inventive concept.
Figure 2B:
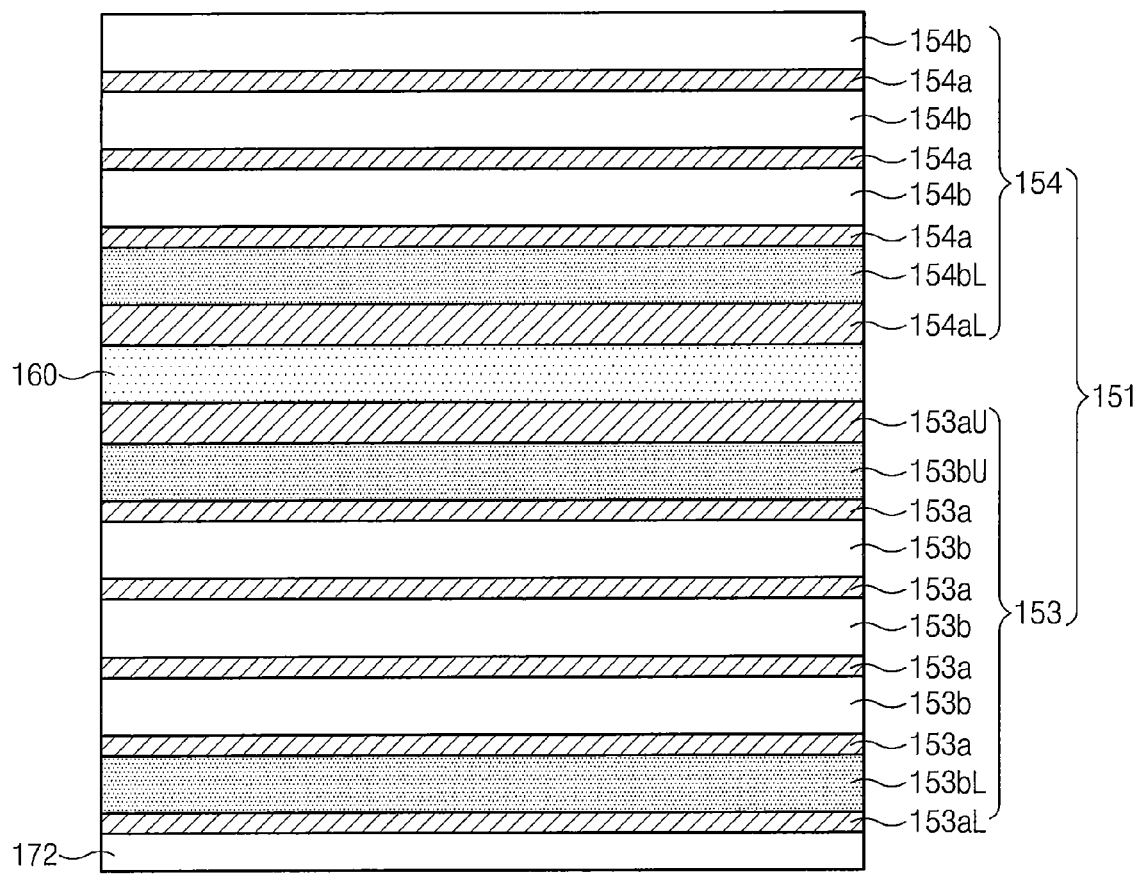
FIGS. 2B through 2C are cross sectional views illustrating a vertical magnetic layer that is included in the magnetic memory device according to the modified version of the first example embodiment of the present inventive concept.
Figure 2C:
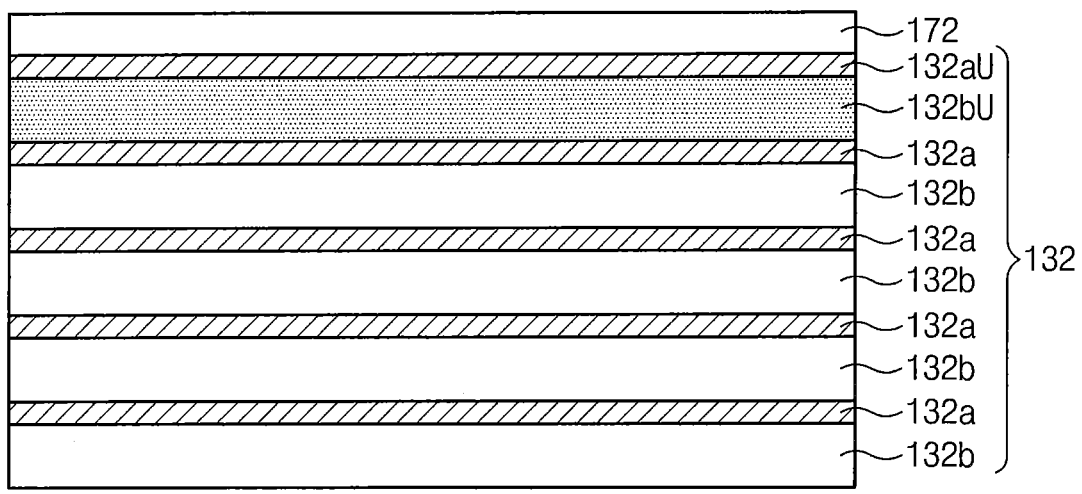

FIG. 2A is a cross sectional view illustrating a magnetic memory device according to a modified version of the first example embodiment of the present inventive concept. FIG. 2B is a cross sectional view illustrating a second vertical magnetic layer that is included in the magnetic memory device of FIG. 2A. FIG. 2C is a cross sectional view illustrating a first vertical magnetic layer that is included in the magnetic memory device of FIG. 2A.

Referring to FIG. 2A, as explained above with reference to FIG. 1A, a lower electrode 105, a first contact magnetic layer 120, a tunnel barrier layer 110, a second contact magnetic layer 140 and a capping layer 180 can be provided on a substrate 100.

A first vertical magnetic layer 132 may be disposed between the lower electrode 105 and the first contact magnetic layer 120. In the case where the current flows in a perpendicular direction with respect to the substrate 100, the first vertical magnetic layer 132 may be constructed to have a magnetization direction parallel and/or anti-parallel with the current.

A first diffusion barrier layer 172 may be disposed between the first vertical magnetic layer 132 and the first contact magnetic layer 120. The first diffusion barrier layer 172 may have a first surface and a second surface that is opposite the first surface. The first surface of the first diffusion barrier layer 172 may be in contact with the first vertical magnetic layer 132, and the second surface of the first diffusion barrier layer 172 may be in contact with the first contact magnetic layer 120. The first diffusion barrier layer 172 may minimize the diffusion of constituent elements of the first contact magnetic layer 120 into the first vertical magnetic layer 132. For example, in the case where the first contact magnetic layer 120 is formed of cobalt (Co), iron (Fe), and/or boron (B), the first diffusion barrier layer 172 may reduce and/or minimize the diffusion of boron (B) in the first contact magnetic layer 120 into the first vertical magnetic layer 132. Due to this reduced diffusion, the vertical magnetic unisotropy of the first contact magnetic layer 120 can be improved. The vertical magnetic unisotropy is a magnetic layer's characteristic to be magnetized in a perpendicular direction with respect to the substrate 100.

In some embodiments, the first diffusion barrier layer 172 may comprise tantalum (Ta), hafnium (Hf), zirconium (Zr), titanium (Ti), tantalum oxide, hafnium oxide, zirconium oxide, titanium oxide, aluminum oxide, and/or manganese oxide. The first diffusion barrier layer 172 can be, for example, approximately 2 Å to approximately 10 Å thick.

The first vertical magnetic layer 132 may comprise alternately and repeatedly stacked non-magnetic and ferromagnetic layers. This will be explained in more detail with reference to FIG. 2C.

Referring to FIG. 2C, the first vertical magnetic layer 132 may comprise alternately and repeatedly stacked ferromagnetic layers 132aU, 132a and non-magnetic layers 132bU, 132b. The first surface of the first diffusion barrier layer 172 may contact the uppermost ferromagnetic layer 132aU among the ferromagnetic layers 132aU, 132a that are included in the first vertical magnetic layer 132. The ferromagnetic layers 132aU, 132a may comprise the same material. For example, the ferromagnetic layers 132aU, 132a may comprise cobalt (Co). The ferromagnetic layers 132aU, 132a may be approximately 2 Å thick.

The uppermost non-magnetic layer 132bU of the first vertical magnetic layer 132 adjoining the first surface of the first diffusion barrier layer 172 may comprise a different material from the rest of the non-magnetic layers 132b. The rest of the non-magnetic layers 132b may comprise the same material. For example, the uppermost non-magnetic layers 132bU may comprise platinum (Pt), while the rest of the non-magnetic layers 132b may comprise palladium (Pd).

Referring again to FIG. 2A, the second vertical magnetic layer 151 may be disposed between the second contact magnetic layer 140 and the capping layer 180. In the case where the current flows in a perpendicular direction with respect to a top surface of the substrate 100, the second vertical magnetic layer 151 may be constructed to have a magnetization direction parallel and/or anti-parallel with the current.

A second diffusion barrier layer 174 may be disposed between the second vertical magnetic layer 151 and the second contact magnetic layer 140. The second diffusion barrier layer 174 may have a first surface and a second surface that is opposite the first surface. The first surface of the second diffusion barrier layer 174 may contact the second vertical magnetic layer 151 and the second surface of the second diffusion barrier layer 174 may contact the second contact magnetic layer 140. The second diffusion barrier layer 174 may reduce and/or minimize the diffusion of constituent elements of the second contact magnetic layer 140 into the second vertical magnetic layer 151. For example, in the case where the second contact magnetic layer 140 is formed of cobalt (Co), iron (Fe), and boron (B), the diffusion of boron (B) in the second contact magnetic layer 140 into the second vertical magnetic layer 151 can be reduced and/or minimized. Due to this reduction in diffusion of elements from the second contact magnetic layer 140 into the second vertical magnetic layer 151, vertical magnetic unisotropy of the second contact magnetic layer 140 can be improved. The second diffusion barrier layer 174 may comprise the same material as the first diffusion barrier layer 172.

The second vertical magnetic layer 151 may comprise a first sub-layer 153 and a second sub-layer 154. An exchange-coupling layer 160 may be interposed between the first sub-layer 153 and the second sub-layer 154, as explained above with reference to FIG. 1A.

The first sub-layer 153 and the second sub-layer 154 may comprise alternately and repeatedly stacked non-magnetic layers and ferromagnetic layers. This will be explained with reference to FIG. 2B.

Referring to FIG. 2B, the first sub-layer 153 may comprise alternately and repeatedly stacked ferromagnetic layers 153aL, 153a, 153aU and non-magnetic layers 153bL, 153b, 153bU. A first surface of the exchange-coupling layer 160 may directly contact the uppermost ferromagnetic layer 153aU among the ferromagnetic layers 153aL, 153a, 153aU included in the first sub-layer 153. The uppermost ferromagnetic material 153aU may be thicker than the rest of the ferromagnetic layers 153a, 153aL. The uppermost non-magnetic layer 153bU and the lowermost non-magnetic layer 153bL of the first sub-layer 153 may comprise a different material from the rest of the non-magnetic layers 153b.

The first surface of the second diffusion barrier layer 174 may contact the lowermost ferromagnetic layer 153aL among the ferromagnetic layers 153aL, 153a, 153aU included in the first sub-layer 153. The lowermost non-magnetic layer 153bL of the first sub-layer 153 adjoining the second diffusion barrier layer 174 may comprise the same material as the uppermost non-magnetic layer 153bU.

The second sub-layer 154 in the device of FIGS. 2A-2C may be identical to the second sub-layer 154 of the device of FIGS. 1A-1B, and hence further description thereof will be omitted herein.

According to a modification of the first example embodiment of the present inventive concept, either one of the first diffusion barrier layer 172 or the second diffusion barrier layer 174 may be omitted.

In the aforementioned first example embodiment of the present inventive concept, the exchange-coupling layer 160 is disposed between the first sub-layer 153 and the second sub-layer 154 of the second vertical magnetic layer 151. In other embodiments, however, the exchange-coupling layer may instead be interposed between the contact magnetic layer and the vertical magnetic layer. This will be explained with reference to FIG. 3A.

Figure 3A:
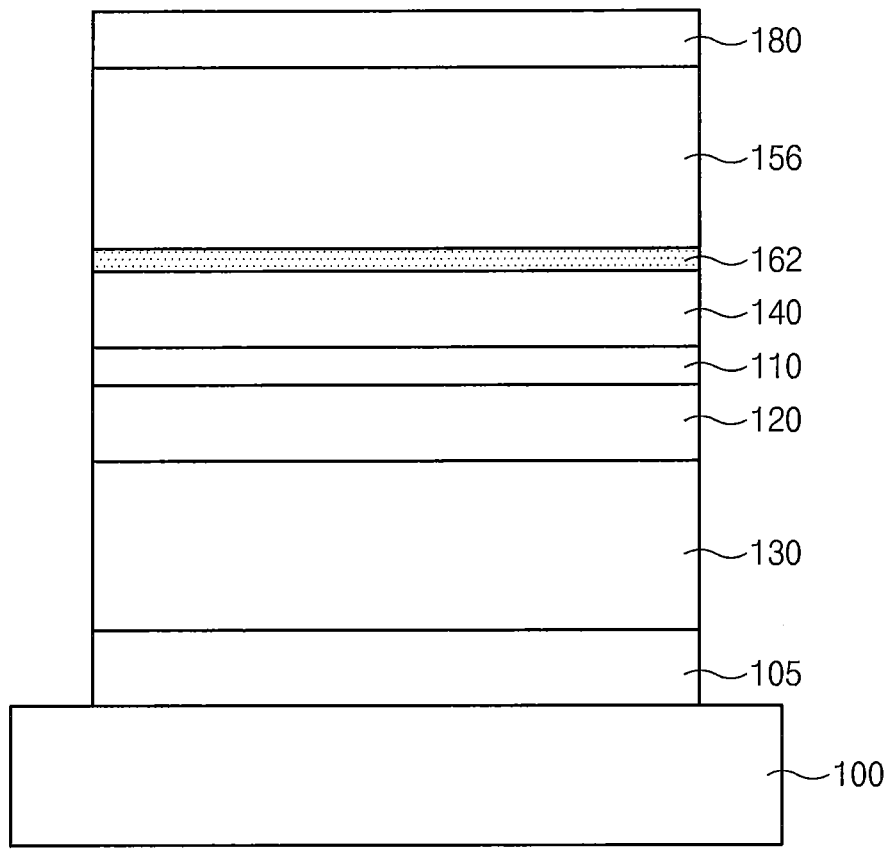
FIG. 3A is a cross sectional view illustrating a magnetic memory device according to a second example embodiment of the present inventive concept.
Figure 3B:
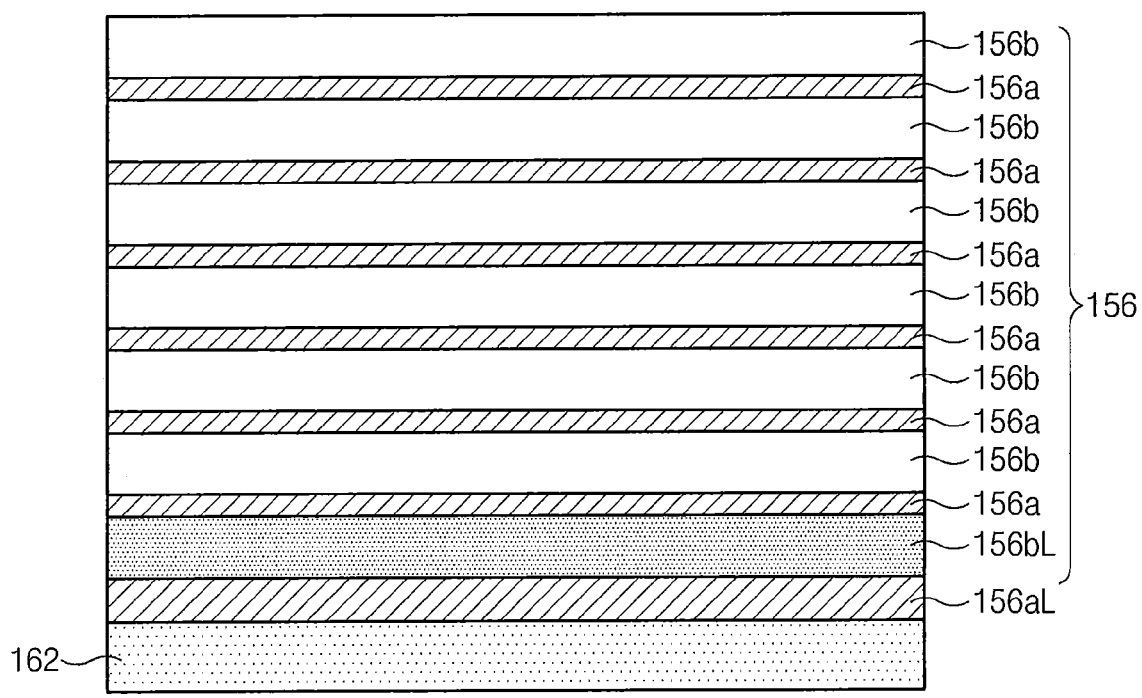
FIG. 3B is a cross sectional view illustrating a vertical magnetic layer that is included in the magnetic memory device according to the second example embodiment of the present inventive concept.

FIG. 3A is a cross sectional view illustrating a magnetic memory device according to a second example embodiment of the present inventive concept. FIG. 3B is a cross sectional view illustrating a vertical magnetic layer that is included in the magnetic memory device according to the second example embodiment of the present inventive concept.

Referring to FIG. 3A, as explained referring to FIG. 1A, a lower electrode 105, a first vertical magnetic layer 130, a first contact magnetic layer 120, a tunnel barrier layer 110, a second contact magnetic layer 140 and a capping layer 180 can be provided on a substrate 100. Since the above-referenced layers of the device of FIGS. 3A-3B are identical to the correspondingly numbered layers of the device of FIGS. 1A-1B, further description thereof will be omitted.

A second vertical magnetic layer 156 may be disposed between the second contact magnetic layer 140 and the capping layer 180. An exchange-coupling layer 162 may be disposed between the second vertical magnetic layer 156 and the second contact magnetic layer 140. A first surface of the exchange-coupling layer 162 may contact the second vertical magnetic layer 156, and a second surface of the exchange-coupling layer 162 that is opposite the first surface may contact the second contact magnetic layer 140. A magnetization direction of the second vertical magnetic layer 156 and a magnetization direction of the second contact magnetic layer 140 may be exchange-coupled in anti-parallel by the exchange-coupling layer 162. The exchange-coupling layer 162 may comprise the same material as the exchange-coupling layer 160, which was discussed above with reference to FIG. 1A.

As shown in FIG. 3B, the second vertical magnetic layer 156 may comprise alternately and repeatedly stacked ferromagnetic layers 156aL, 156a, and non-magnetic layers 156bL, 156b. The first surface of the exchange-coupling layer 162 may contact the lowermost ferromagnetic layer 156aL among the ferromagnetic layers 156aL, 156a included in the second vertical magnetic layer 156. The lowermost ferromagnetic layer 156aL may be thicker than the rest of the ferromagnetic layers 156a included in the second vertical magnetic layer 156. The thicknesses of the rest of the ferromagnetic layers 156a may be substantially the same. For example, the lowermost ferromagnetic layer 156aL may be approximately 5 Å thick and the rest of the ferromagnetic layers 156a may be approximately 2 Å thick. The ferromagnetic layers 156a, 156aL may comprise the same material. For example, the ferromagnetic layers 156a, 156aL may comprise cobalt (Co).

The lowermost non-magnetic layer 156bL of the second vertical magnetic layer 156 may comprise a different material from the rest of the non-magnetic layers 156b. The rest of the non-magnetic layers 156b may comprise a same material. For example, the lowermost non-magnetic layers 156bL may comprise platinum (Pt) and the rest of the non-magnetic layer 156b may comprise palladium (Pd).

A magnetic memory device according to the aforementioned second example embodiment of the present inventive concept may further include a diffusion layer between the first contact magnetic layer 120 and the first vertical magnetic layer 130. This modification to the device of FIGS. 3A-3B will be explained with reference to FIG. 4.

Figure 4:
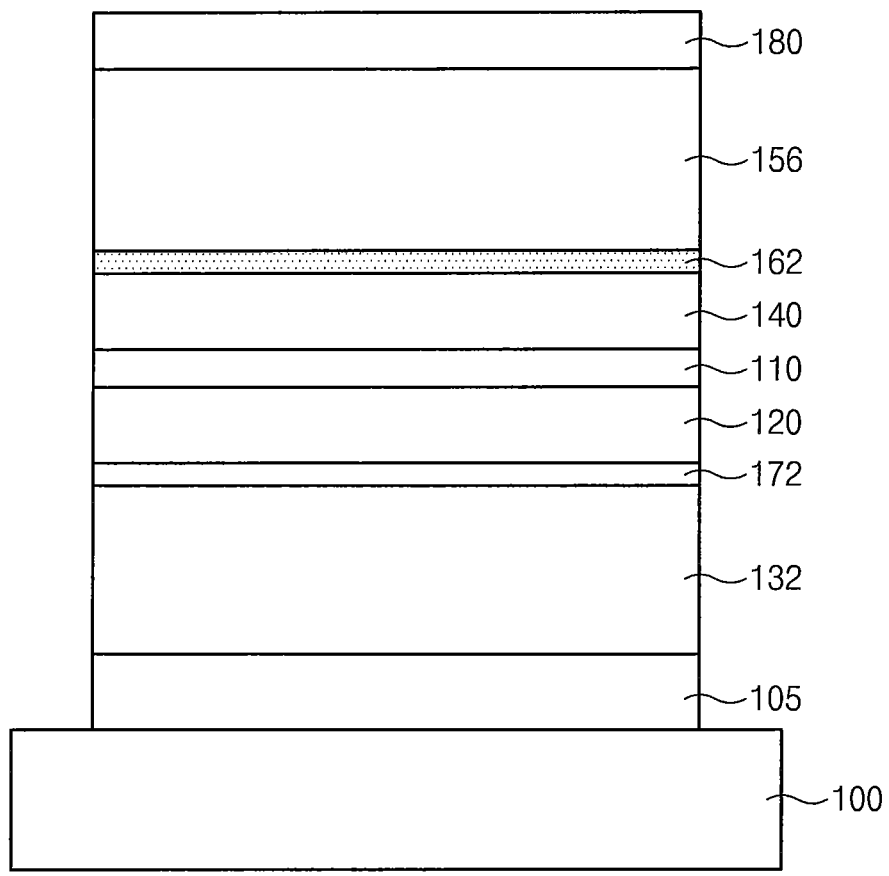
FIG. 4 is a cross sectional view illustrating a magnetic memory device according to a modified version of the second example embodiment of the present inventive concept.

FIG. 4 is a cross sectional view illustrating a magnetic memory device according to a modification of the second example embodiment of the present inventive concept.

Referring to FIG. 4, as explained above with reference to FIG. 1A, a lower electrode 105, a first contact magnetic layer 120, a tunnel barrier layer 110, a second contact magnetic layer 140 and a capping layer 180 can be provided on a substrate 100. Since the above-referenced layers of the device of FIG. 4 are identical to the correspondingly numbered layers of the device of FIGS. 1A-1B, further description thereof will be omitted. Additionally, an exchange-coupling layer 162 and a second vertical magnetic layer 156 may be disposed between the second contact magnetic layer 140 and the capping layer 180. Since the above-referenced layers of the device of FIG. 4 are identical to the correspondingly numbered layers of the device of FIGS. 3A-3B, further description thereof will also be omitted.

A first vertical magnetic layer 132 may be disposed between the lower electrode 105 and the first contact magnetic layer 120. A diffusion barrier layer 172 may be disposed between the first vertical magnetic layer 132 and the first contact magnetic layer 120. The first vertical magnetic layer 132 may be identical to the vertical magnetic layer 132, which was discussed above with reference to FIG. 2C, and the diffusion barrier layer 172 may be identical to the first diffusion barrier layer 172, which was discussed above with reference to FIG. 2A.

According to the aforementioned second embodiment of the present inventive concept, an exchange-coupling layer 162 can be interposed between the second vertical magnetic layer 156 and the second contact magnetic layer 140. A second exchange-coupling layer may be further interposed between the first vertical magnetic layer and the first contact magnetic layer 120. This will be explained with reference to FIGS. 5A and 5B.

Figure 5A:
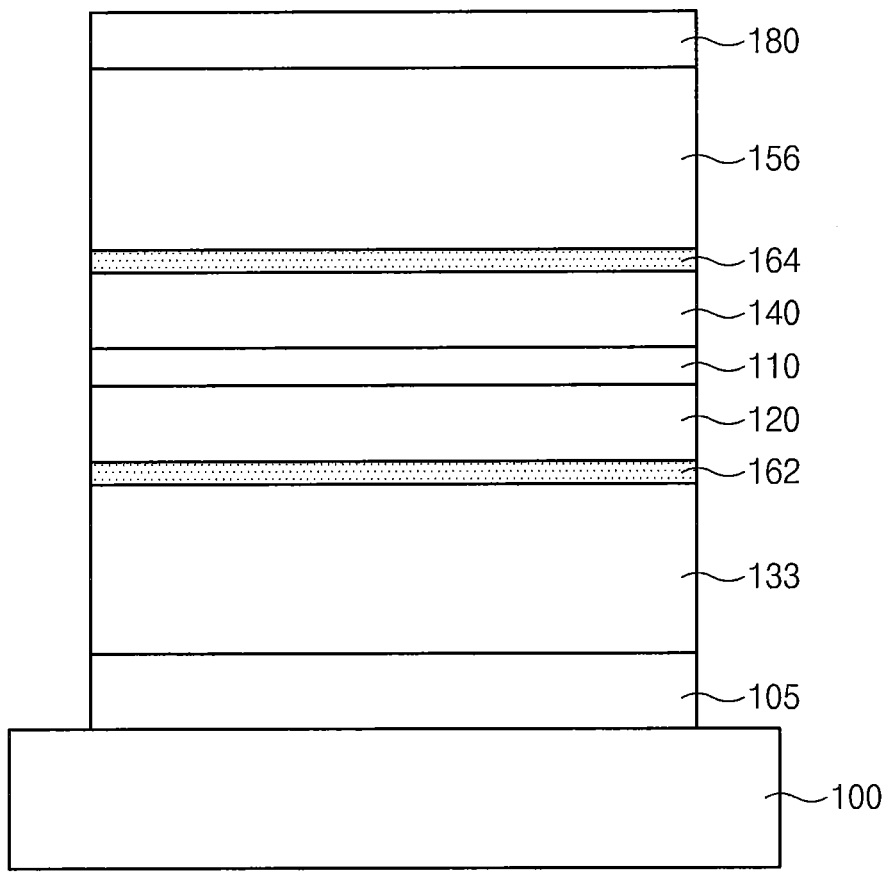
FIG. 5A is a cross sectional view illustrating a magnetic memory device according to a third example embodiment of the present inventive concept.
Figure 5B:
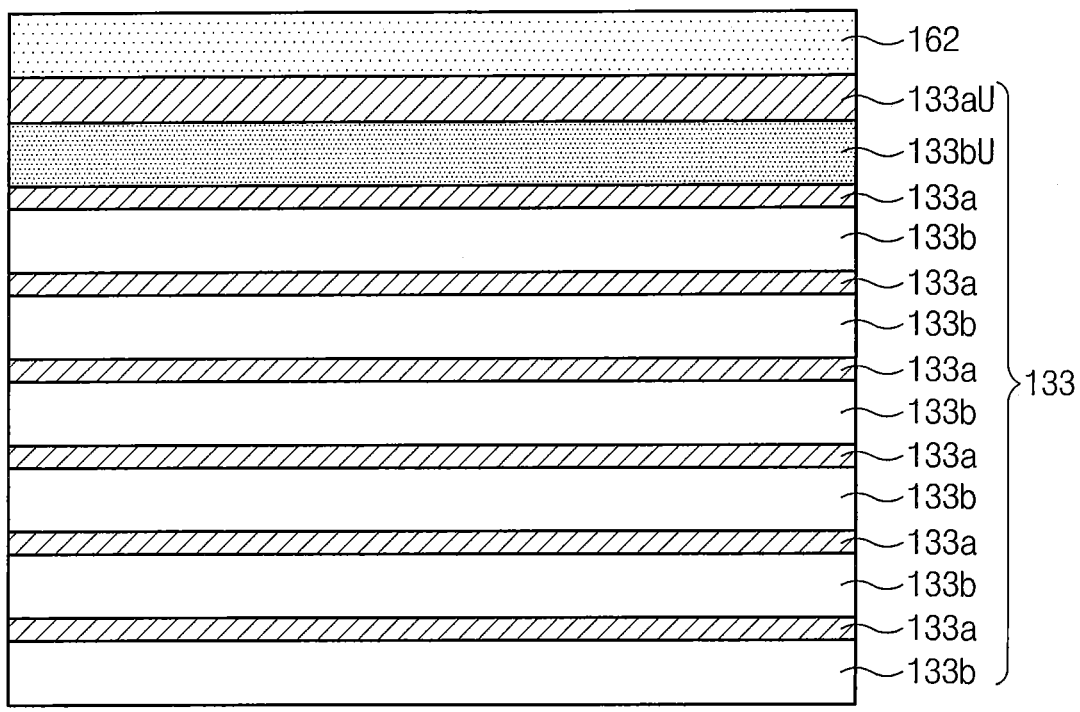
FIG. 5B is a cross sectional view illustrating a vertical magnetic layer that is included in the magnetic memory device according to the third example embodiment of the present inventive concept.

FIG. 5A is a cross sectional view illustrating a magnetic memory device according to a third example embodiment of the present inventive concept. FIG. 5B is a cross sectional view illustrating a vertical magnetic layer that is included in the magnetic memory device according to the third example embodiment of the present inventive concept.

Referring to FIG. 5A, as explained above with reference to FIG. 1A, a lower electrode 105, a first contact magnetic layer 120, a tunnel barrier layer 110, a second contact magnetic layer 140 and a capping layer 180 can be provided on a substrate 100.

A first vertical magnetic layer 133 may be disposed between the first contact magnetic layer 120 and the lower electrode 105. A first exchange-coupling layer 162 may be disposed between the first vertical magnetic layer 133 and the first contact magnetic layer 120. The first vertical magnetic layer 133 may contact a first surface of the first exchange-coupling layer 162, and the first contact magnetic layer 120 may contact a second surface of the first exchange-coupling layer 162 that is opposite the first surface.

A magnetization direction of the first vertical magnetic layer 133 and a magnetization direction of the first contact magnetic layer 120 may be exchange-coupled in anti-parallel by the first exchange-coupling layer 162. The exchange-coupling layer 162 may comprise the same material as the exchange-coupling layer 160, which was discussed above with reference to FIG. 1A.

The first vertical magnetic layer 133 may comprise alternately and repeatedly stacked ferromagnetic and non-magnetic layers. This will be explained with reference to FIG. 5B.

Referring to FIG. 5B, the first vertical magnetic layer 133 may comprise alternately and repeatedly stacked ferromagnetic layers 133a, 133aU and non-magnetic layers 133b, 133bU. The first surface of the first exchange-coupling layer 162 may contact the uppermost ferromagnetic layer 133aU among the ferromagnetic layers 133a, 133aU included in the first vertical magnetic layer 133. The uppermost ferromagnetic layer 133aU may be thicker than the rest of the ferromagnetic layers 133a included in the first vertical magnetic layer 133. The thicknesses of the rest of the ferromagnetic layers 133a may be substantially the same. For example, the uppermost ferromagnetic layer 133aU may be approximately 5 Å thick and the rest of the ferromagnetic layers 133a may be approximately 2 Å thick. The uppermost ferromagnetic layer 133aU may comprise the same material as the rest of the ferromagnetic layer 133a. For example, the ferromagnetic layers 133aU, 133a may comprise cobalt (Co).

The uppermost non-magnetic layer 133bU of the first vertical magnetic layer 133 may comprise a different material than the rest of the non-magnetic layers 133b. The rest of the non-magnetic layers 133b may comprise a same material. For example, the uppermost non-magnetic layers 133bU may comprise platinum (Pt) and the rest of the non-magnetic layers 133b may comprise palladium (Pd).

A second vertical magnetic layer 156 may be disposed between the second contact magnetic layer 140 and the capping layer 180. A second exchange-coupling layer 164 may be disposed between the second vertical magnetic layer 156 and the second contact magnetic layer 140. The second vertical magnetic layer 156 and the second exchange-coupling layer 164 may comprise the same material as the second vertical magnetic layer 156 and the exchange-coupling layer 162, respectively, of FIGS. 3A-3B.

According to the aforementioned first embodiment of the present inventive concept, an exchange-coupling layer 160 can be interposed between the first sub-layer 152 and the second sub-layer 154 of the second vertical magnetic layer 150. Another exchange-coupling layer may be further interposed between the second vertical magnetic layer 150 and the second contact magnetic layer 140. This will be explained with reference to FIG. 6A.

Figure 6A:
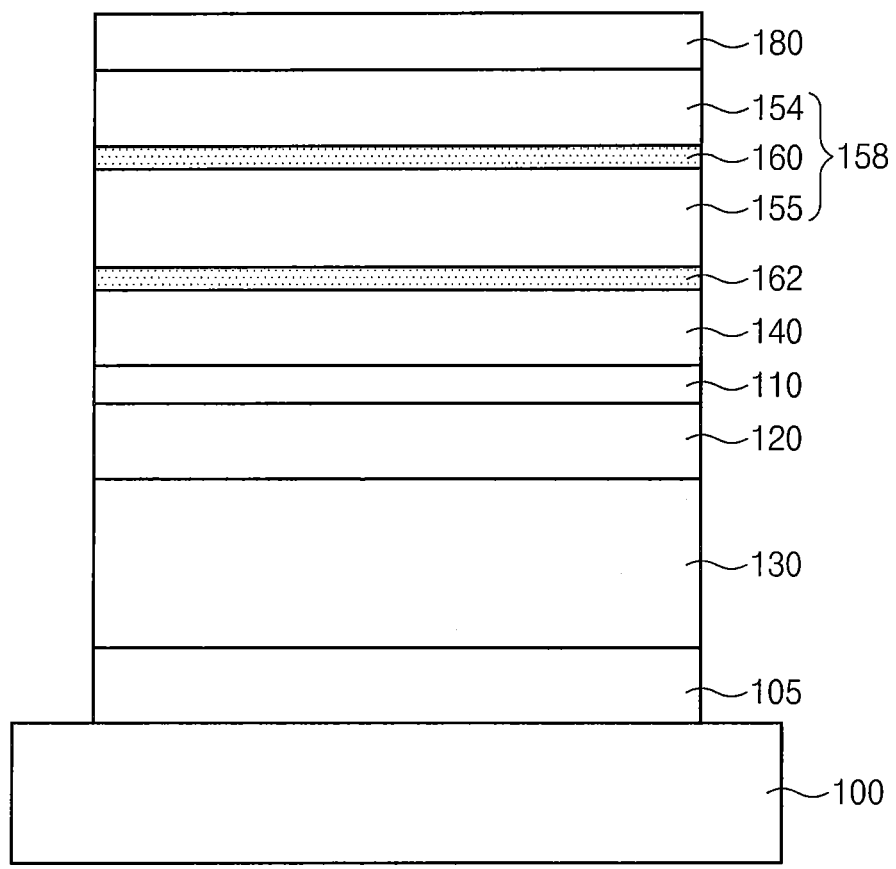
FIG. 6A is a cross sectional view illustrating a magnetic memory device according to a fourth example embodiment of the present inventive concept.
Figure 6B:
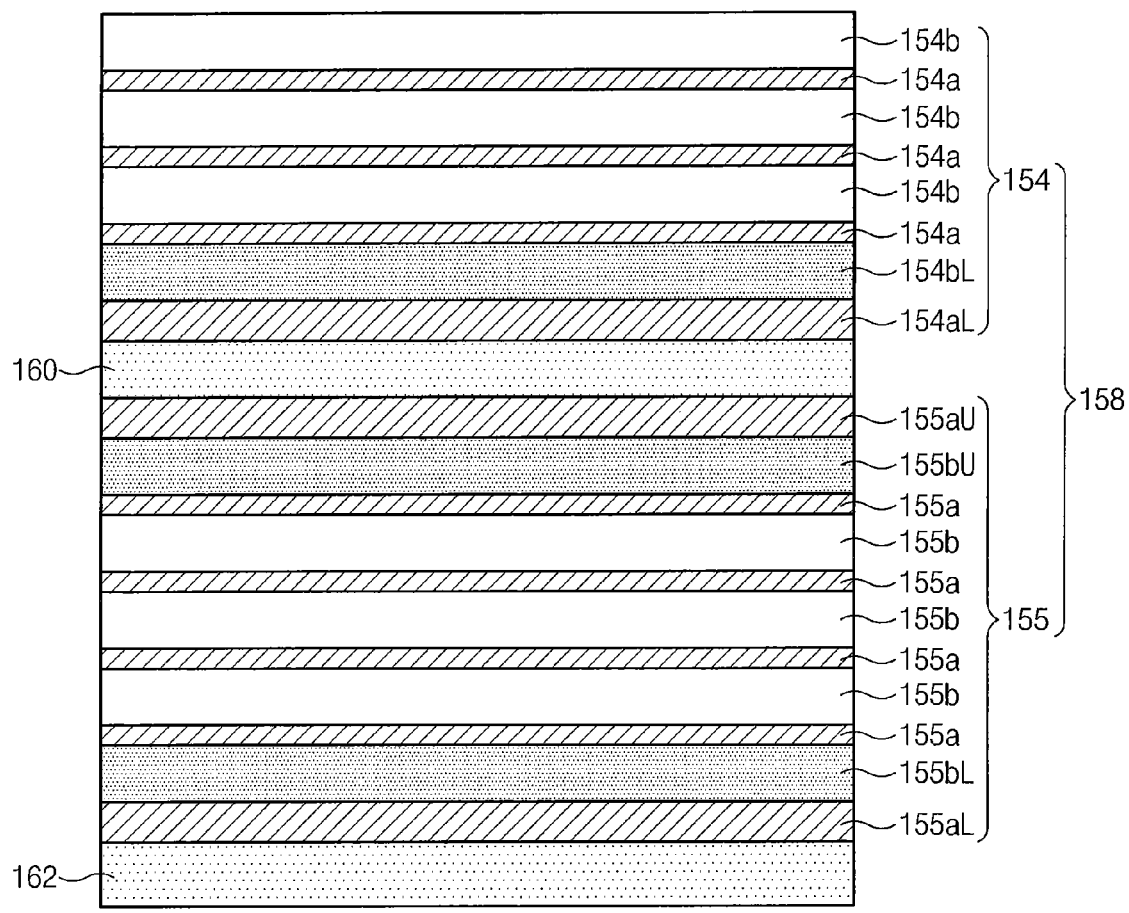
FIG. 6B is a cross sectional view illustrating a vertical magnetic layer that is included in the magnetic memory device according to the fourth example embodiment of the present inventive concept.

FIG. 6A is a cross sectional view illustrating a magnetic memory device according to a fourth example embodiment of the present inventive concept. FIG. 6B is a cross sectional view illustrating a vertical magnetic layer that is included in the magnetic memory device according to the fourth example embodiment of the present inventive concept.

Referring to FIG. 6A, as explained above with reference to FIG. 1A, a lower electrode 105, a first vertical magnetic layer 130, a first contact magnetic layer 120, a tunnel barrier layer 110, a second contact magnetic layer 140 and a capping layer 180 are provided on a substrate 100.

A second vertical magnetic layer 158 may be disposed between the second contact magnetic layer 140 and the capping layer 180. The second vertical magnetic layer 158 may comprise a first sub-layer 154 and a second sub-layer 155. A first exchange-coupling layer 160 may be disposed between the first sub-layer 154 and the second sub-layer 155. A first surface of the first exchange-coupling layer 160 may contact the first sub-layer 154 and a second surface of the first exchange-coupling layer 160 that is opposite to the first surface may contact the second sub-layer 155.

A magnetization direction of the first sub-layer 154 and a magnetization direction of the second sub-layer 155 may be exchange-coupled in anti-parallel by the first exchange-coupling layer 160.

A second exchange-coupling layer 162 may be disposed between the second sub-layer 155 and the second contact magnetic layer 140. A first surface of the second exchange-coupling layer 162 may contact the second sub-layer 155 and a second surface of the second exchange-coupling layer 162 that is opposite to the first surface may contact the second contact magnetic layer 140. A magnetization direction of the second sub-layer 155 and a magnetization direction of the second contact magnetic layer 140 may be exchange-coupled in anti-parallel by the second exchange-coupling layer 162.

The second sub-layer 155 may directly contact both the first exchange-coupling layer 160 and the second exchange-coupling layer 162. The first sub-layer 154 and the second contact magnetic layer 140 may have the same magnetization direction. The first and second exchange-coupling layers 160, 162 may comprise the same material as the exchange-coupling layer 160 discussed above with reference to FIG. 1A.

The first sub-layer 154 and the second sub-layer 155 may comprise alternately and repeatedly stacked non-magnetic layers and ferromagnetic layers. This will be explained with reference to FIG. 6B.

Referring to FIG. 6B, the first sub-layer 154 may comprise the same material as the second sub-layer 154 that was discussed above with reference to FIG. 1B.

The second sub-layer 155 may comprise alternately and repeatedly stacked ferromagnetic layers 155aL, 155a, 155aU and non-magnetic layers 155bL, 155b, 155bU. The second surface of the exchange-coupling layer 160 may contact the uppermost ferromagnetic layer 155aU among the ferromagnetic layers 155aL, 155a, 155aU included in the second sub-layer 155. The first surface of the second exchange-coupling layer 162 may contact the lowermost ferromagnetic layer 155aL among the ferromagnetic layers 155aL, 155a, 155aU included in the second sub-layer 155. The uppermost and lowermost ferromagnetic materials 155aU, 155aL may be thicker than the rest of the ferromagnetic layers 155a. The thickness of the rest of the ferromagnetic layers 155a may be substantially the same. For example, the lowermost and uppermost ferromagnetic layers 155aL, 155aU may be approximately 5 Å thick and the rest of the ferromagnetic layers 155a may be approximately 2 Å thick. The rest of the non-magnetic layers 155aL, 155a, 155aU may comprise a same material. For example, the ferromagnetic layers 155aL, 155a, 155aU may comprise cobalt (Co).

The uppermost non-magnetic layer 155bU of the second sub-layer 155 and the lower most non-magnetic layer 155bL of the second sub-layer 155 may comprise a different material from the rest of the non-magnetic layers 155b. The rest of the non-magnetic layers 155b may comprise a same material. For example, the lowermost and uppermost non-magnetic layers 155bL, 155bU may comprise platinum (Pt) and the rest of the non-magnetic layers 155b may comprise palladium (Pd).

In a memory device according to the aforementioned fourth embodiment of the present inventive concept, a diffusion barrier layer may be further interposed between the first contact magnetic layer 120 and the first vertical magnetic layer 130. This will be explained with reference to FIG. 7.

Figure 7:
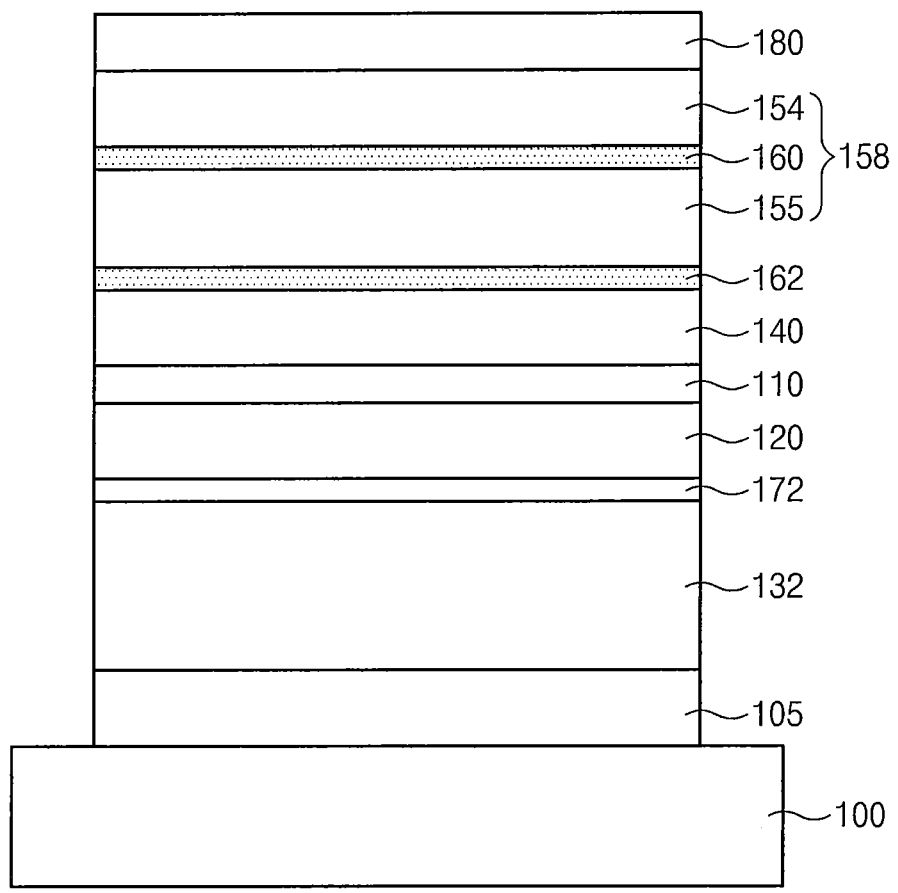
FIG. 7 is a cross sectional view illustrating a magnetic memory device according to a modified version of the fourth example embodiment of the present inventive concept.

FIG. 7 is a cross sectional view illustrating a magnetic memory device according to a modification of the fourth example embodiment of the present inventive concept.

Referring to FIG. 7, as explained above with reference to FIG. 1A, a lower electrode 105, a first contact magnetic layer 120, a tunnel barrier layer 110, a second contact magnetic layer 140 and a capping layer 180 can be provided on a substrate 100. A first exchange-coupling layer 160 and a second exchange-coupling layer 162 may be provided between the second contact magnetic layer 140 and the capping layer 180, as explained above with reference to FIG. 6A.

A first vertical magnetic layer 132 may be provided between the first contact magnetic layer 120 and the lower electrode 105. A diffusion barrier layer 172 may be disposed between the first vertical magnetic layer 132 and the first contact magnetic layer 120. The first vertical magnetic layer 132 may be identical to the first vertical magnetic layer 132 that is discussed above with reference to FIG. 2C, and the diffusion barrier layer 172 may be identical to the first diffusion barrier layer 172 that is discussed above with reference to FIG. 2A.

Different from the aforementioned modification of the fourth example embodiment of the present inventive concept, an exchange-coupling layer may be interposed between the first vertical magnetic layer 132 and the first contact magnetic layer 120 in place of the diffusion barrier layer. This will be explained with reference to FIG. 8.

Figure 8:
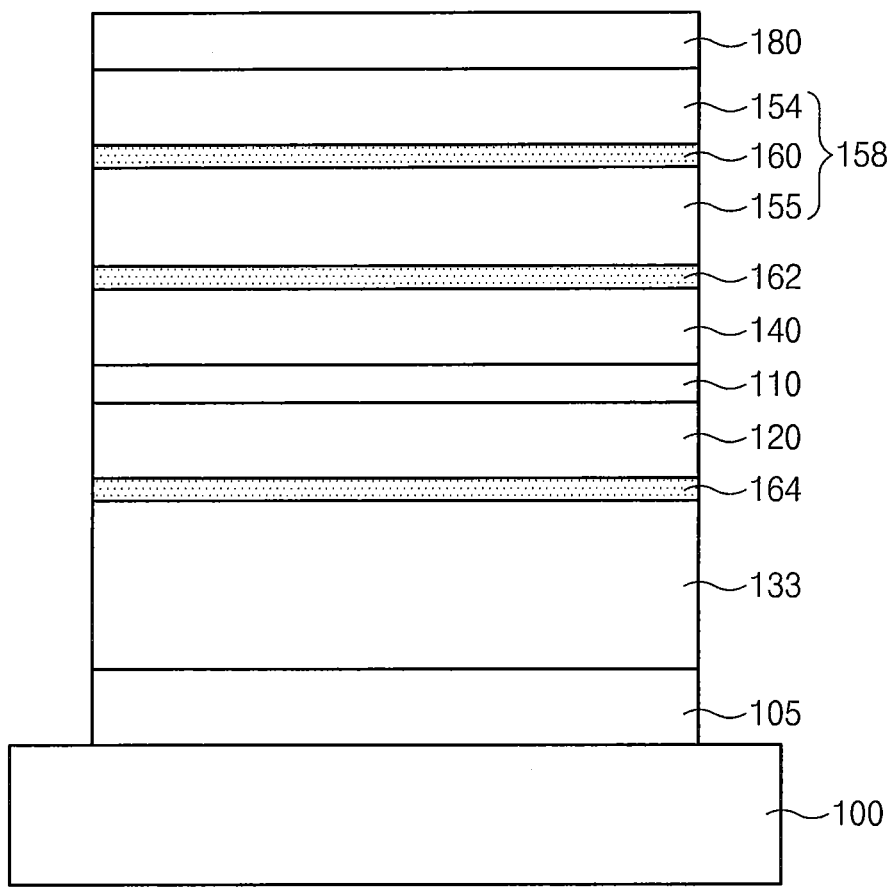
FIG. 8 is a cross sectional view illustrating a magnetic memory device according to a fifth example embodiment of the present inventive concept.

FIG. 8 is a cross sectional view illustrating a magnetic memory device according to a fifth example embodiment of the present inventive concept.

Referring to FIG. 8, as explained above with reference to FIG. 1A, a lower electrode 105, a first contact magnetic layer 120, a tunnel barrier layer 110, a second contact magnetic layer 140 and a capping layer 180 can be provided on a substrate 100. A first exchange-coupling layer 160 and a second exchange-coupling layer 162 and a third vertical magnetic layer 158 may be provided between the second contact magnetic layer 140 and the capping layer 180, as explained above with reference to FIG. 6A.

A first vertical magnetic layer 133 may be provided between the lower electrode 105 and the first contact magnetic layer 120, and a third exchange-coupling layer 164 may be disposed between the first vertical magnetic layer 133 and the first contact magnetic layer 120. A magnetization direction of the first vertical magnetic layer 133 and a magnetization direction of the first contact magnetic layer 120 may be exchange-coupled in anti-parallel by the third exchange-coupling layer 164. The first vertical magnetic layer 133 may comprise the same material as the first vertical magnetic layer 132 that is discussed above with reference to FIG. 5B, and the third exchange-coupling layer 164 may comprise the same material as the first exchange-coupling layer 162 that is discussed above with reference to FIG. 3A.

A magnetic memory device according to the aforementioned fifth example embodiment of the present inventive concept may further comprise additional exchange-coupling layer(s). This will be explained with reference to FIG. 9A.

Figure 9A:
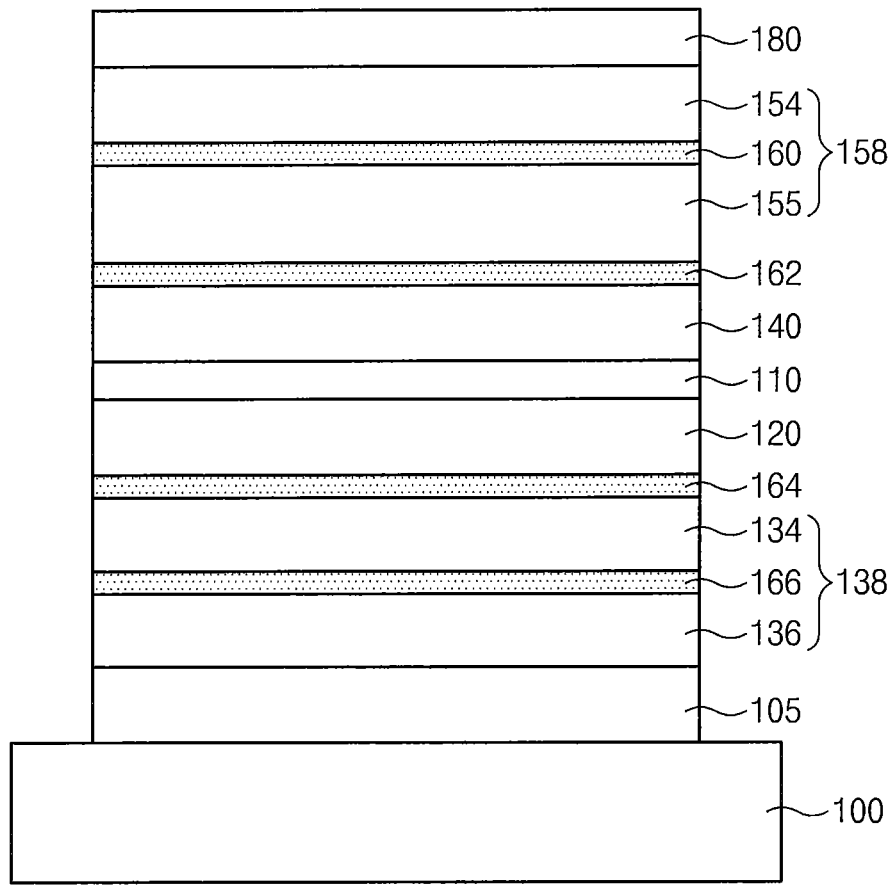
FIG. 9A is a cross sectional view illustrating a magnetic memory device according to a sixth example embodiment of the present inventive concept.
Figure 9B:
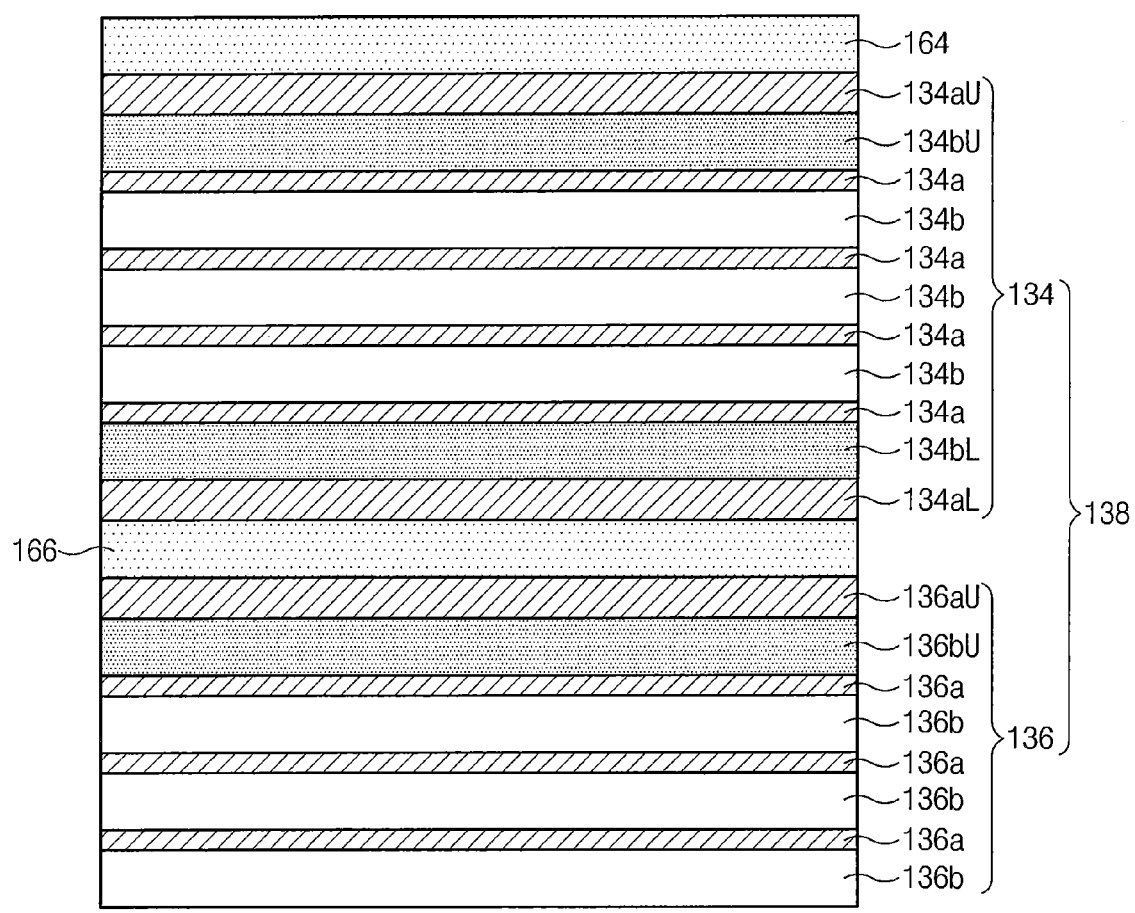
FIG. 9B is a cross sectional view illustrating a vertical magnetic layer that is included in the magnetic memory device according to the sixth example embodiment of the present inventive concept.

FIG. 9A is a cross sectional view illustrating a magnetic memory device according to a sixth example embodiment of the present inventive concept. FIG. 9B is a cross sectional view illustrating a vertical magnetic layer that is included in the magnetic memory device according to the sixth example embodiment of the present inventive concept.

Referring to FIG. 9A, as explained above with reference to FIG. 1A, a lower electrode 105, a first contact magnetic layer 120, a tunnel barrier layer 110, a second contact magnetic layer 140 and a capping layer 180 can be provided on a substrate 100. A vertical magnetic layer 158, a first exchange-coupling layer 160 and a second exchange-coupling layer 162 may be provided between the second contact magnetic layer 140 and the capping layer 180, as explained above with reference to FIG. 6A.

A first vertical magnetic layer 138 may be provided between the first contact magnetic layer 120 and the lower electrode 105. A third exchange-coupling layer 164 may be disposed between the first vertical magnetic layer 138 and the first contact magnetic layer 120. The third exchange-coupling layer 164 may comprise the same material as the third exchange-coupling layer 164 that is discussed above with reference to FIG. 8.

The first vertical magnetic layer 138 may comprise a first sub-layer 134 and a second sub-layer 136. A magnetization direction of the first sub-layer 134 and a magnetization direction of the first contact magnetic layer 120 may be exchange-coupled in anti-parallel by the third exchange-coupling layer 164.

A fourth exchange-coupling layer 166 may be interposed between the first sub-layer 134 and the second sub-layer 136. The fourth exchange-coupling layer 166 may have a first surface and a second surface that are opposite to each other. The first sub-layer 134 may contact the first surface of the fourth exchange-coupling layer 166, and the second sub-layer 136 may contact the second surface of the fourth exchange-coupling layer 166. A magnetization direction of the first sub-layer 134 and a magnetization direction of the second sub-layer 136 may be exchange-coupled in anti-parallel by the fourth exchange-coupling layer 166. The second sub-layer 136 and the first contact magnetic layer 120 may have a same magnetization direction. The fourth exchange-coupling layer 166 may comprise the same material as the exchange-coupling layer 160 that is discussed above with reference to FIG. 1A.

The first sub-layer 134 and the second sub-layer 136 may comprise alternately and repeatedly stacked non-magnetic and ferromagnetic layers. This will be explained with reference to FIG. 9B.

Referring to FIG. 9B, the first sub-layer 134 may comprise alternately and repeatedly stacked ferromagnetic layers 134aL, 134a, 134aU and non-magnetic layers 134bL, 134b, 134bU. The first surface of the third exchange-coupling layer 164 may contact the uppermost ferromagnetic layer 134aU among the ferromagnetic layers 134aL, 134a, 134aU that are included in the first sub-layer 134. The first surface of the fourth exchange-coupling layer 166 may contact the lowermost ferromagnetic layer 134aL among the ferromagnetic layers 134aL, 134a, 134aU that are included in the first sub-layer 134. The uppermost and lowermost ferromagnetic materials 134aU, 134aL may be thicker than the rest of the ferromagnetic layers 134a. The thickness of the rest of the ferromagnetic layers 134a may be substantially the same. For example, the lowermost and uppermost ferromagnetic layers 134aL, 134aU may be approximately 5 Å thick and the rest of the ferromagnetic layers 134a may be approximately 2 Å thick. The ferromagnetic layers 134aL, 134a, 134aU may comprise a same material. For example, the ferromagnetic layers 134aL, 134a, 134aU may comprise cobalt (Co).

The uppermost non-magnetic layer 134bU of the first sub-layer 134 and the lowermost non-magnetic layer 134bL of the first sub-layer 134 may comprise a different material from the rest of the non-magnetic layers 134b. The rest of the non-magnetic layers 134b may comprise a same material. For example, the lowermost and uppermost non-magnetic layers 134bL, 134bU may comprise platinum (Pt) and the rest of the non-magnetic layers 134b may comprise palladium (Pd).

The second sub-layer 136 may comprise alternately and repeatedly stacked ferromagnetic layers 136a, 136aU and non-magnetic layers 136b, 136bU. The second surface of the fourth exchange-coupling layer 166 may contact the uppermost ferromagnetic layer 136aU among the ferromagnetic layers 136a, 136aU included in the second sub-layer 136. The uppermost ferromagnetic layer 134aU may be thicker than the rest of the ferromagnetic layers 136a included in the second sub-layer 136. The thickness of the rest of the ferromagnetic layers 136a may be substantially the same. For example, the uppermost ferromagnetic layers 136aU may be approximately 5 Å thick and the rest of the ferromagnetic layers 136a may be approximately 2 Å thick. The uppermost ferromagnetic layers 136aU may comprise the same material as the rest of the ferromagnetic layers 136a. For example, the ferromagnetic layers 136aU, 136a may comprise cobalt (Co).

The uppermost non-magnetic layer 136bU of the second sub-layer 136 may comprise a different material from the rest of the non-magnetic layers 136b. The rest of the non-magnetic layers 136b may comprise a same material. For example, the uppermost non-magnetic layers 136bU may comprise platinum (Pt) and the rest of the non-magnetic layers 136b may comprise palladium (Pd).

Magnetic memory devices according to the aforementioned example embodiments of the present inventive concept can be implemented in various forms of semiconductor packages. For example, magnetic memory devices according to example embodiments of the present inventive concept can be packaged by various packaging methods such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP) and/or Wafer-Level Processed Stack Package (WSP). The packages mounting magnetic memory devices according to example embodiments of the present inventive concept may further comprise controllers and/or logic devices to control the semiconductor devices.

Figure 10:
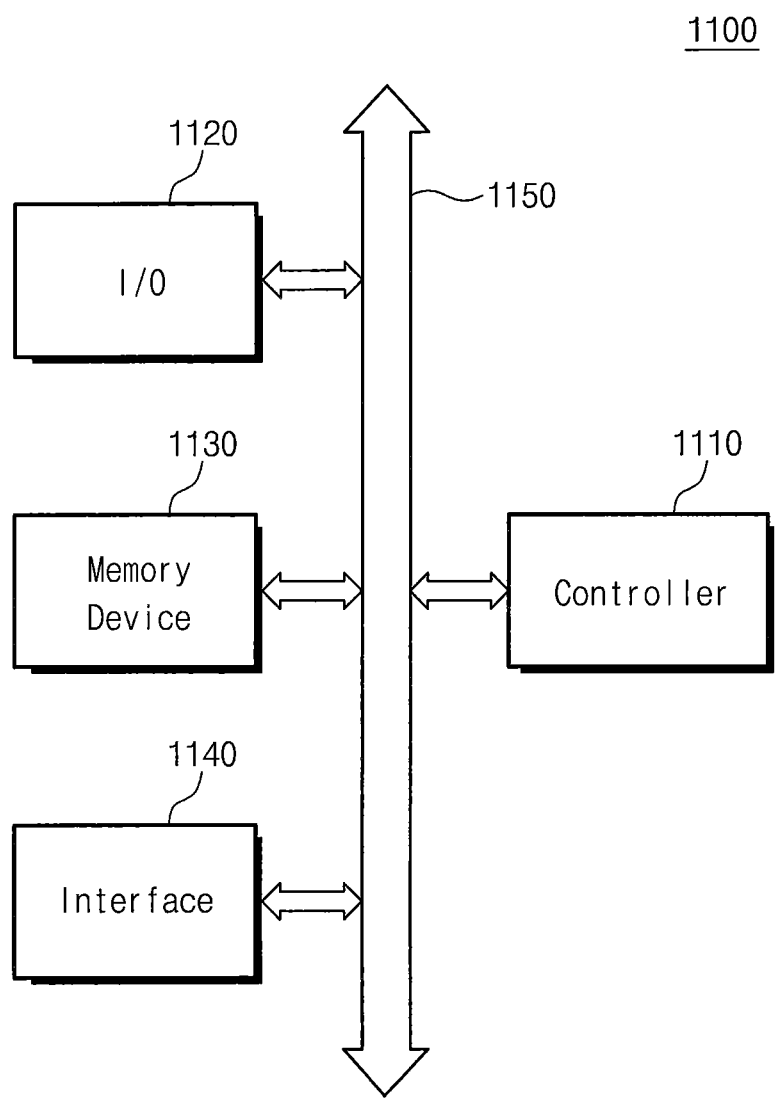
FIG. 10 is a block diagram illustrating an electronic system that includes a magnetic memory device according to example embodiments of the present inventive concept.

FIG. 10 is a block diagram illustrating an electronic system that includes a magnetic memory device according to example embodiments of the present inventive concept.

Referring to FIG. 10, an electronic system 1100 according to example embodiments of the present invention may comprise a controller 1110, an input/output device (I/O) 1120, a memory device 1130, an interface 1140 and a bus 1150. The controller 1110, the input/output device 1120, the memory device 1130 and/or the interface 1140 can be coupled to each other through the bus 1150. The bus 1150 corresponds to a data communication path.

The controller 1100 may comprise at least one selected from the group consisting of a microprocessor, a digital signal processor, a microcontroller and a logic device performing similar functions to the foregoing devices. The input/output device 1120 may include keypad, keyboard and/or display devices. The memory device 1130 may store data and/or instructions. The memory device 1130 may comprise at least one magnetic memory device according to example embodiments of the present inventive concept. Further, the memory device 1130 may further comprise different forms of semiconductor memory devices such as Flash memory, DRAM and/or SRAM devices. The interface 1140 may send data to communication network or receive data from the communication network. The interface 1140 may be wireless or wired. For example, the interface 1140 may include an antenna or wired/wireless transceiver. Although not illustrated herein, the electronic system 1100 may further comprise a high speed DRAM and/or SRAM as an operation memory to improve operation of the controller 1110.

The electronic system 1100 may be applied to Personal Digital Assistant (PDA), portable computer, web tablet, wireless phone, mobile phone, digital music player, memory card, or various kinds of electronic equipment that can wirelessly send and receive data.

Figure 11:
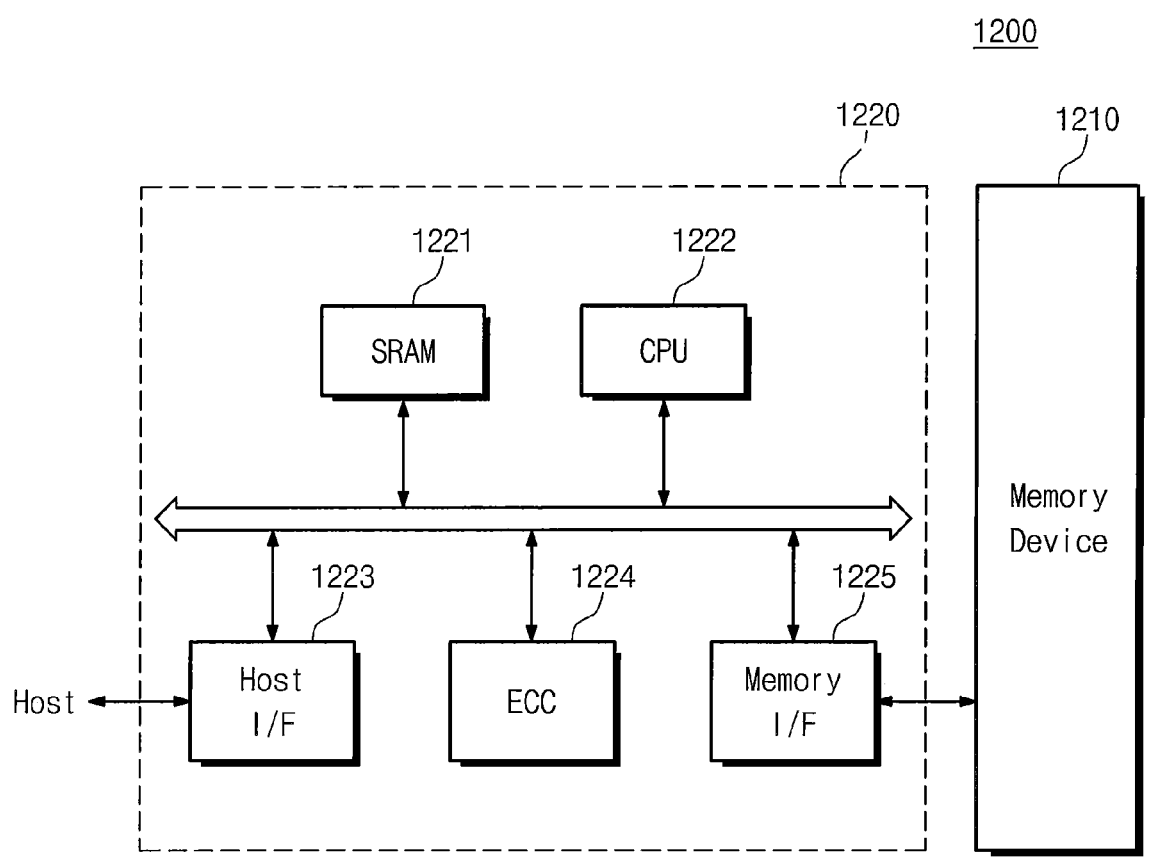
FIG. 11 is a block diagram illustrating a memory card that includes a magnetic memory device according to example embodiments of the present inventive concept.

FIG. 11 is a block diagram illustrating a memory card including a magnetic memory device according to example embodiments of the present inventive concept.

Referring to FIG. 11, a memory card 1200 according to example embodiments of the present inventive concept may comprise a memory device 1210. The memory device 1210 may comprise at least one magnetic memory device disclosed herein according to example embodiments of the present inventive concept. Further, the memory device 1210 may further comprise different forms of semiconductor memory devices such as DRAM and/or SRAM devices. The memory card 1200 may further comprise a memory controller 1220 controlling data exchange between a host and the memory device 1210.

The memory controller 1220 may comprise a processing unit to control overall operation of the memory card. The memory controller 1220 may further comprise an SRAM 1221 used as an operation memory of the memory controller 1220. Further, the memory controller 1220 may further comprise a host interface 1223 and a memory interface 1225. The host interface 1223 may be equipped with a data exchange protocol between the memory card 1200 and a host device. The memory interface 1225 may couple the memory controller 1220 with the memory device 1210. The memory controller 1220 may further comprise an error correction block (ECC) 1224. The error correction block 1224 may detect and correct errors in the read-out data from the memory device 1210. Although not illustrated herein, the memory card 1200 may further comprise a ROM device storing code data for interfacing with the host. The memory card 1200 may be used as a portable data storage card. Conversely, the memory card 1200 can be implemented as solid-state disks, which can replace conventional hard disks of computer systems.

Although a few example embodiments of the present inventive concept have been described with reference to the enclosed drawings, those who are skilled in the art will readily appreciate that various modifications are possible from the example embodiments without materially departing from the novel teachings and advantages of the present inventive concept. Accordingly, the example embodiments disclosed hereinabove are to explain the present inventive concept and should not be used to limit the meaning or the scope of the invention defined in the claims.

What is claimed is:

1. A magnetic memory device comprising:
   a fixed layer comprising;
      a first contact magnetic layer including Co, Fe and B and having a first saturation magnetization;
      a vertical magnetic layer having perpendicular magnetization; and
      an exchange coupling layer disposed between the first contact magnetic layer and the vertical magnetic layer;
   a free layer having a second saturation magnetization; and
   a tunnel barrier layer disposed between the free layer and the fixed layer, wherein the first saturation magnetization is higher than the second saturation magnetization.

2. The magnetic memory device of claim 1, wherein a thickness of the first contact magnetic layer is smaller than a thickness of the vertical magnetic layer.

3. The magnetic memory device of claim 1, wherein the vertical magnetic layer comprises at least one of Cr, Pt, Pd, or Ir.

4. A magnetic memory device comprising:
   a fixed layer comprising;
      a first contact magnetic layer including Co, Fe and B;
      a vertical magnetic layer having perpendicular magnetization; and
      an exchange coupling layer disposed between the first contact magnetic layer and the vertical magnetic layer;
   a free layer; and
   a tunnel barrier layer disposed between the free layer and the fixed layer.

5. The magnetic memory device of claim 4, wherein a thickness of the first contact magnetic layer is smaller than a thickness of the vertical magnetic layer.

6. The magnetic memory device of claim 4, wherein the vertical magnetic layer comprises at least one of Cr, Pt, Pd, or Ir.

7. The magnetic memory device of claim 4, wherein the exchange coupling layer comprises Ru.

8. The magnetic memory device of claim 4, wherein the free layer including Co, Fe and B.

\* \* \* \* \*